US012785031B2

(12) United States Patent
Han et al.

(10) Patent No.: US 12,785,031 B2
(45) Date of Patent: Nov. 3, 2026

(54) IN-SITU MECHANICAL MICRO-ELECTRO-MECHANICAL DEVICE AND SYSTEM, AS WELL AS DOUBLE-TILT SAMPLE HOLDER

(71) Applicant: Beijing University of Technology, Beijing (CN)

(72) Inventors: Xiaodong Han, Beijing (CN); Jiabao Zhang, Beijing (CN); Jianfei Zhang, Beijing (CN); Xudong Yang, Beijing (CN)

(73) Assignee: Beijing University of Technology, Beijing (CN)

( * ) Notice: Subject to any disclaimer, the term of this patent is extended or adjusted under 35 U.S.C. 154(b) by 255 days.

(21) Appl. No.: 18/794,084

(22) Filed: Aug. 5, 2024

(65) Prior Publication Data

US 2025/0054725 A1 Feb. 13, 2025

(30) Foreign Application Priority Data

Aug. 7, 2023 (CN) ........................ 202310984258.9

(51) Int. Cl.
*H01J 37/20* (2006.01)

(52) U.S. Cl.
CPC ..... *H01J 37/20* (2013.01); *H01J 2237/20207* (2013.01)

(58) Field of Classification Search
None
See application file for complete search history.

(56) References Cited

U.S. PATENT DOCUMENTS

2008/0029492 A1* 2/2008 Adachi .................. H01J 37/20 219/121.6
2010/0059127 A1* 3/2010 Shibata .................. F04B 43/14 137/565.11
2018/0209860 A1* 7/2018 Okada .................. G01L 3/1442

OTHER PUBLICATIONS

Wang, Xiaodong, et al., "A Memes Device for Quantitative in situ Mechanical Testing in Electron Microscope," Micromachines, vol. 8 (2017) (17 pages).

(Continued)

*Primary Examiner* — Andrew Smyth
(74) *Attorney, Agent, or Firm* — Thomas | Horstemeyer, LLP

(57) ABSTRACT

Provided are an in-situ mechanical micro-electro-mechanical device and system, as well as a double-tilt sample holder. A first displacement member is arranged in a first hollow-out cavity of a base through a first mechanical measurement assembly, extends to a third hollow-out cavity of the base, and is provided with a first sample carrying portion at an extending end thereof. A second displacement member is arranged in a second hollow-out cavity of the base through a second mechanical measurement assembly, extends to the third hollow-out cavity, and is provided with a second sample carrying portion at an extending end thereof. The second sample carrying portion is nested with the first sample carrying portion. One of the first displacement member and the second displacement member is fixedly arranged, and the other of the first displacement member and the second displacement member is connected to a driving component.

20 Claims, 12 Drawing Sheets

(56) References Cited

OTHER PUBLICATIONS

Zhu, Yong, et al., “An electromechanical material testing system for in situ electron microscopy and applications,” PNAS, vol. 102, No. 41 (2005), pp. 14506-14508.
Zhang, Jianfei, et al., “Timely and atomic-resolved high-temperature mechanical investigation of ductile fractre and atomistic mechanisms of tungsten,” Nature Communications, vol. 12 (2018) (10 pages).
Wang, Lihua, et al., “Tracking the sliding of grain boundaries at the atomic scale,” Science, vol. 375 (2022), pp. 1261-1265.

* cited by examiner

IN-SITU MECHANICAL MICRO-ELECTRO-MECHANICAL DEVICE AND SYSTEM, AS WELL AS DOUBLE-TILT SAMPLE HOLDER

CROSS-REFERENCE TO RELATED APPLICATION

This patent application claims the benefit and priority of Chinese Patent Application No. 202310984258.9 filed with the China National Intellectual Property Administration on Aug. 7, 2023, the disclosure of which is incorporated by reference herein in its entirety as part of the present application.

TECHNICAL FIELD

The present disclosure relates to the technical field of in situ mechanical studies at the atomic scale based on transmission electron microscopes, and in particular to an in-situ mechanical micro-electro-mechanical device and system, as well as a double-tilt sample holder.

BACKGROUND

TEM (Transmission electron microscope) has become an important scientific instrument for analyzing the material structure of samples due to its ability to emit high-energy electron beams through samples to characterize the material structure at the atomic scale.

The experimental system for mechanical properties of a material at the atomic scale based on TEM can apply loading modes such as tension and compression on a sample while characterizing the sample at the atomic scale, and obtain the stress-strain curves of the sample in real time, thus studying the relationship between the evolution of atomic structure and mechanical properties of the material. This technology is called TEM-based in-situ mechanical technology.

TEM-based in-situ mechanical technology is to integrate a mechanical module on the sample holder of TEM, and then to apply a load to the material. The mechanical properties of the material can be quantitatively measured in a case that a mechanical sensor is further designed and installed in the module.

For example, the probe-type in-situ mechanical holder applies a stress field on the sample by driving a front probe with a piezoelectric ceramic motor, and quantitatively measures the mechanical properties of the sample in combination with sensors, such as a capacitive sensor and a piezoresistive sensor. If the material is to be characterized at the atomic scale, the sample needs to be double-tilted to the zone axis around the a axis and B axis. Because of the larger size of the driver of the probe-type in-situ mechanical holder, the driving shaft extends through the body of the sample holder, resulting in the loss of the function of β axis tilting, and making it difficult to in-situ observe the evolution of the atomic structure of the material during the mechanical loading.

For this purpose, Professor Han Xiaodong at Beijing University of Technology developed bimetallic thermal drive deformation technology and in-situ mechanical technology based on MEMS (micro-electro-mechanical system) in *Tracking the sliding of grain boundaries at the atomic scale and Timely and atomic-resolved high-temperature mechanical investigation of ductile fracture and atomistic mechanisms of tungsten* respectively by miniaturization of the driver, and realized the characterization of materials at the atomic scale in the process of introducing stress field. On this basis, Wang et al. further integrated a piezoresistive displacement sensor into the MEMS system in *A MEMS device Quantitative in Situ Mechanical Testing in Electron Microscope*, in which the resistance of a piezoresistor changes during the deformation of the material, which leads to the change of an output voltage of the Wheatstone bridge, thus achieving the quantitative measurement of the stress and deformation amount of the material. However, the piezoresistive sensor is easy to generate Joule heat, higher thermal noise and thermal drift difficult to be filtered out during operation of the piezoresistive sensor, making the quantitative measurement performance poor.

For this purpose, according to the advantages that the signal accuracy of the capacitor at different working temperatures can be guaranteed as the capacitor is insensitive to the working temperature, Espinosa research group at Northwestern University in the United States developed a MEMS device integrated with capacitive displacement sensors in *An electromechanical material testing system for in situ electron microscopy and applications*, realizing the displacement and load measurement with low signal drift. However, since a micro-capacitance signal acquisition device is separated from an in-situ sample holder and placed outside the holder body, the micro-capacitance signal acquisition device is far away from a capacitance sensor circuit, resulting in a high parasitic capacitance. In the application process, the external electromagnetic clutter has a great crosstalk to signal transmission, so that it is difficult to achieve quantitative measurement with low noise and high mechanical resolution.

SUMMARY

A first aspect of the present disclosure is to provide an in-situ mechanical micro-electro-mechanical device to solve at least one technical defect in the above technical problems, so that the load and deformation amount of a sample can be stably measured at high mechanical resolution while characterizing a sample at the atomic scale, thus establishing a relationship between material atomic structure evolution and mechanical properties of the sample fundamentally.

A second aspect of the present disclosure is to provide an in-situ mechanical micro-electro-mechanical system.

A third aspect of the present disclosure is to provide a double-tilt sample holder.

An in-situ mechanical micro-electro-mechanical system provided by the first aspect of the present disclosure includes:

- a base, provided with a first hollow-out cavity, a second hollow-out cavity, and a third hollow-out cavity, wherein the third hollow-out cavity is located between the first hollow-out cavity and the second hollow-out cavity;
- a first displacement member, where the first displacement member is arranged in the first hollow-out cavity through a first mechanical measurement assembly, extends to the third hollow-out cavity, and is provided with a first sample carrying portion at an extending end thereof; and
- a second displacement member, where the second displacement member is arranged in the second hollow-out cavity through a second mechanical measurement assembly, extends to the third hollow-out cavity, and is provided with a second sample carrying portion at an extending end thereof, and the second sample carrying portion is nested with the first sample carrying portion.

One of the first displacement member and the second displacement member is fixedly arranged, and an other of the first displacement member and the second displacement member is connected to a driving component.

According to the in-situ mechanical micro-electro-mechanical device provided by the present disclosure, the first mechanical measurement assembly includes a first elastic support member, a first sensor assembly, and a first conductor wire assembly. The first elastic support member and the first sensor assembly are connected to an integrated module through the first conductor wire assembly.

The first elastic support member is located on a moving path of the first displacement member and fixedly connected to the first displacement member, and both ends of the first elastic support member are fixed to the base.

The first sensor assembly is arranged on at least one side of the first displacement member, and part of the first sensor assembly is adapted to move with the first displacement member to change a capacitance of the first sensor assembly.

According to the in-situ mechanical micro-electro-mechanical device provided by the present disclosure, the first sensor assembly includes multiple first fixed polar plates, and multiple first follow-up polar plates.

The multiple first follow-up polar plates are arranged on the first displacement member at intervals in a moving direction of the first displacement member.

The multiple first fixed polar plates are arranged on the base at intervals in the moving direction of the first displacement member, and each of the multiple first fixed polar plates is located between two adjacent first follow-up polar plates.

According to the in-situ mechanical micro-electro-mechanical device provided by the present disclosure, the first conductor wire assembly includes a first branch conductor wire, and a second branch conductor wire.

The first branch conductor wire is connected to the multiple first fixed polar plates through a metal adhesive layer arranged on the base.

The second branch conductor wire is connected to the first elastic support member through a pressure welding zone arranged on the base.

According to the in-situ mechanical micro-electro-mechanical device provided by the present disclosure, the second mechanical measurement assembly includes a second elastic support member, a second sensor assembly, and a second conductor wire assembly. The second elastic support member and the second sensor assembly are connected to the integrated module through the second conductor wire assembly.

The second elastic support member is located on a moving path of the second displacement member and fixedly connected to the second displacement member, and both ends of the second elastic support member are fixed to the base.

The second sensor assembly is arranged on at least one side of the second displacement member, and part of the second sensor assembly is adapted to move with the second displacement member to change a capacitance of the second sensor assembly.

According to the in-situ mechanical micro-electro-mechanical device provided by the present disclosure, the second sensor assembly includes multiple second fixed polar plates, and multiple second follow-up polar plates.

The multiple second follow-up polar plates are arranged on the second displacement member at intervals in a moving direction of the second displacement member.

The multiple second fixed polar plates are arranged on the base at intervals in the moving direction of the second displacement member, and each of the multiple second fixed polar plates is located between two adjacent second follow-up polar plates.

According to the in-situ mechanical micro-electro-mechanical device provided by the present disclosure, the second conductor wire assembly includes a third branch conductor wire, and a fourth branch conductor wire.

The third branch conductor wire is connected to the multiple second fixed polar plates through a metal adhesive layer arranged on the base.

The fourth branch conductor wire is connected to the second elastic support member through a pressure welding zone arranged on the base.

The present disclosure further provides an in-situ mechanical micro-electro-mechanical system, including an integrated module, a signal acquisition module, and the in-situ mechanical micro-electro-mechanical device of any embodiment described above.

The integrated module is electrically connected to the in-situ mechanical micro-electro-mechanical device through a first flexible conductor wire, and the integrated module is electrically connected to the signal acquisition module through a second flexible conductor wire.

According to the in-situ mechanical micro-electro-mechanical system provided by the present disclosure, the integrated module includes multiple capacitance acquisition interfaces, a capacitance acquisition-conversion circuit and signal output interfaces which are connected to one another. The multiple capacitance acquisition interfaces are connected to the in-situ mechanical micro-electro-mechanical device through the first flexible conductor wire, and the signal output interfaces are connected to the signal acquisition module through the second flexible conductor wire.

According to the in-situ mechanical micro-electro-mechanical system provided by the present disclosure, the signal acquisition module comprises a single chip microcomputer, and signal acquisition interfaces and a serial communication interface which are connected to the single chip microcomputer. The signal acquisition interface is connected to the signal output interface through the second flexible conductor wire.

The present disclosure further provides a double-tilt sample holder which is used based on transmission electron microscope, including:

a driving device;

a rod body, including a supporting body, and a driving rod, where the supporting body is provided with a hollow cavity, the driving rod penetrates through the hollow cavity, one end of the driving rod is connected to the driving device and the driving rod is adapted to reciprocate along an inner wall of the hollow cavity under an action of the driving device;

a tilting table, rotatably connected to the supporting body and hinged with the driving rod, where the tilting table is adapted to move with the driving rod for tilting;

the in-situ mechanical micro-electro-mechanical system of any embodiment described above, where various parts of the in-situ mechanical micro-electro-mechanical system are arranged on the tilting table, the rod body and the driving device, respectively.

According to a double-tilt sample holder provided by the present disclosure, the tilting table includes:

a tilting body, provided with a U-shaped tilting slot;

a mounting table, located in the tilting slot and rotatably connected to the tilting body;

- a connecting rod, where one end of the connecting rod is rotatably connected to the mounting table, and an other end of the connecting rod is rotatably connected to the driving rod; and
- a carrying member, fixedly arranged on the mounting table, where the carrying member is provided with a carrying cavity, and the in-situ mechanical micro-electro-mechanical device of the in-situ mechanical micro-electro-mechanical system is embedded into the carrying cavity.

According to a double-tilt sample holder provided by the present disclosure, a front end of the supporting body is provided with motion guide slots, the connecting rod is rotatably connected to the mounting table through a rotating shaft, and the rotating shaft is in sliding fit with the motion guide slots.

According to a double-tilt sample holder provided by the present disclosure, the driving device includes:

- a housing, provided with a first chamber and a second chamber separated from each other, where the first chamber is close to the rod body, and the second chamber is hermetically arranged; and
- a driving member, arranged in the first chamber and connected to the driving rod.

The signal acquisition module in the in-situ mechanical micro-electro-mechanical system is arranged in the second chamber.

In the in-situ mechanical micro-electro-mechanical device provided by an embodiment of the present disclosure, one of the first displacement member and the second displacement member is fixedly arranged, and the other of the first displacement member and the second displacement member is connected to the driving component, so that the driving component tensions or compresses the first displacement member or the second displacement member, thus applying stress to the first displacement member and the second displacement member. Through the nested arrangement of the second sample carrying portion and the first sample carrying portion, when the sample is placed on the sample carrying portion, the driving component can apply various stress fields on the sample based on the first sample carrying portion and the second sample carrying portion in nested arrangement, i.e., to tension or compress the sample. Further, through the first mechanical measurement assembly and the second mechanical measurement assembly connected to the first displacement member and the second displacement member respectively, the changes of the displacement of the first displacement member and the displacement of the second displacement member and the stress on the sample can be measured. By calculating a difference between the displacement of the first displacement member and the displacement of the second displacement member, the deformation amount of the sample can be obtained. Therefore, the relationship between the material atomic structure evolution and mechanical properties of the sample can be fundamentally established in the TEM-based in-situ mechanical technology.

The in-situ mechanical micro-electro-mechanical system provided by the embodiment of the present disclosure has all the advantages of the in-situ mechanical micro-electromechanical device as the in-situ mechanical micro-electro-mechanical device is included. In addition to that, the in-situ mechanical micro-electro-mechanical system provided by the embodiment of the present disclosure can transmit capacitance signals collected by the first sensor assembly and the second sensor assembly to the integrated module through the first flexible conductor wire, the capacitance signals can be converted into voltage signals by the integrated module, and then the voltage signals can be converted into digital signals, and the digital signals can be transmitted to the signal acquisition module through the second flexible conductor wire. In this way, the signal intercommunication of the in-situ mechanical micro-electro-mechanical system can be realized, and in addition, the whole in-situ mechanical micro-electro-mechanical system can be reversely powered by the signal acquisition module.

The double-tilt sample holder provided by the embodiment of the present disclosure has all the advantages of the in-situ mechanical micro-electro-mechanical system as the in-situ mechanical micro-electro-mechanical system is included. In addition to that, the front end of the supporting body is rotatably connected to the tilting table, and the rear end of the tilting table is rotatably connected to the front end of the driving rod, such that the driving device can reciprocate in an axial direction of the driving rod to tilt the tilting table.

Compared with the prior art, the double-tilt sample holder provided by the embodiment of the present disclosure can reduce the distance from a capacitance sensor circuit, and reduce a parasitic capacitance existing in the circuit as the in-situ mechanical micro-electro-mechanical system is combined into the double-tilt sample holder. During application, the crosstalk of external electromagnetic clutter on signal transmission is reduced, and the quantitative measurement with low noise and high mechanical resolution is achieved.

BRIEF DESCRIPTION OF THE DRAWINGS

To describe the technical solutions of the present disclosure or in the prior art more clearly, the following briefly introduces the accompanying drawings required for describing the embodiments or the prior art. Apparently, the accompanying drawings in the following description show merely some embodiments of the present disclosure, and those of ordinary skill in the art may still derive other drawings from these accompanying drawings without creative efforts.

REFERENCE NUMERALS

Figure 1:
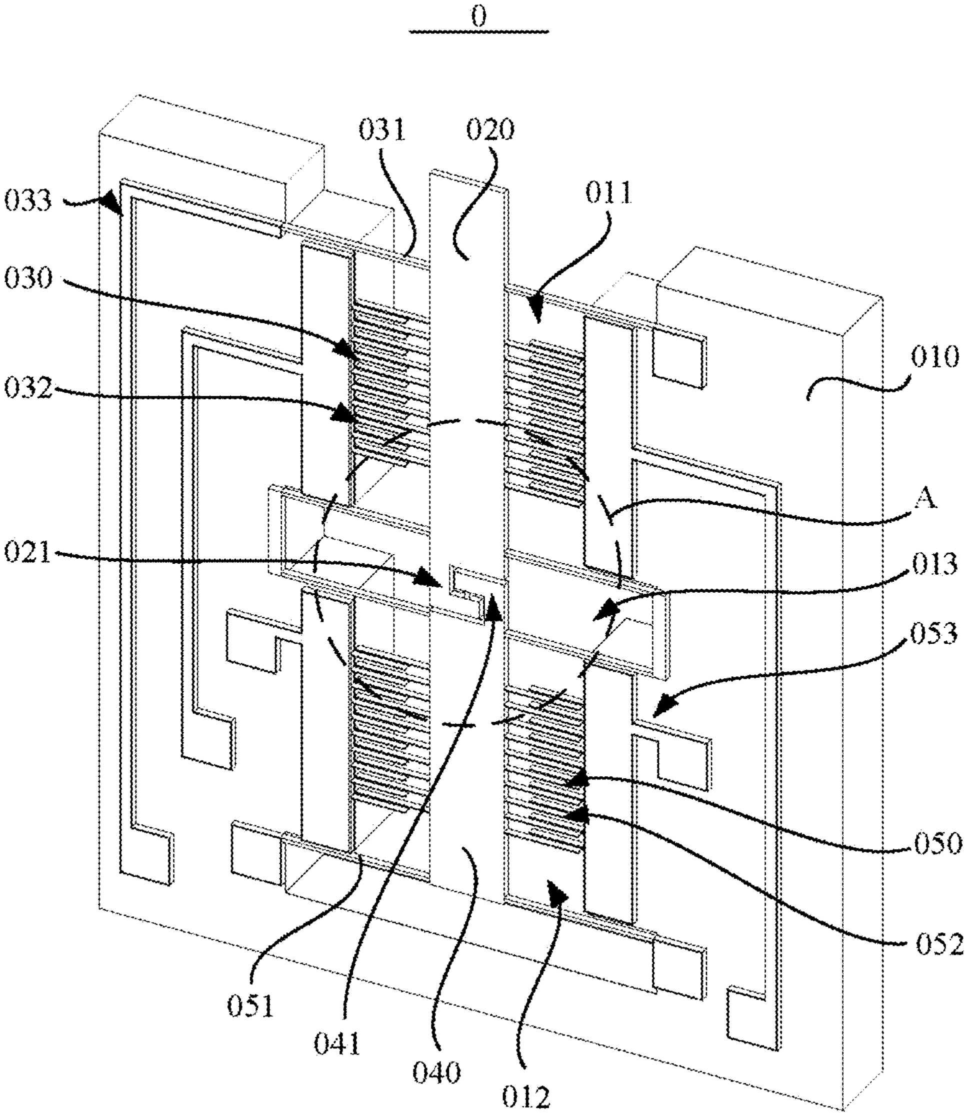
FIG. 1 is structural schematic diagram of an in-situ mechanical micro-electro-mechanical device according to an embodiment of the present disclosure.

0 in-situ mechanical micro-electro-mechanical device;

010 base; 011 first hollow-out cavity; 012 second hollow-out cavity; 013 third hollow-out cavity; 016 sample; 017 driving component;

020 first displacement member; 021 first sample carrying portion;

030 first mechanical measurement assembly; 031 first elastic support member; 032 first sensor assembly; 0321 first fixed polar plate; 0322 first follow-up polar plate; 033 first conductor wire assembly; 0331 first branch conductor wire; 0332 second branch conductor wire;

040 second displacement member; 041 second sample carrying portion;

050 second mechanical measurement assembly; 051 second elastic support member; 052 second sensor assembly; 0521 second fixed polar plate; 0522 second follow-up polar plate; 053 second conductor wire assembly; 0531 third branch conductor wire; 0532 fourth branch conductor wire;

1 in-situ mechanical micro-electro-mechanical system;

110 integrated module; 111 capacitance acquisition interface; 112 capacitance acquisition-conversion circuit; 113 signal output interface;

120 signal acquisition module; 121 single chip microcomputer; 122 signal acquisition interface; 123 serial communication interface;

130 first flexible conductor wire;

2 double-tilt sample holder;

210 rod body; 211 supporting body; 3111 motion guide slot; 212 driving rod; 2121 fixing shaft;

220 tilting table; 221 tilting body; 2211 tilting slot; 222 mounting table; 2221 inclined portion; 2222 horizontal portion; 2223 electron beam through hole; 223 connecting rod; 224 carrying member; 2241 carrying cavity; 2242 carrying portion;

230 driving device; 231 housing; 2311 first chamber; 2312 second chamber; 232 driving member.

DETAILED DESCRIPTION OF THE EMBODIMENTS

The implementations of the present disclosure are further described below in detail with reference to accompanying drawings and embodiments. The following embodiments are used to illustrate the present disclosure rather than limiting the scope of the present disclosure.

In the description of the embodiments of the present disclosure, it needs to be understood that the orientation or positional relationship indicated by terms "center", "longitudinal", "transverse", "upper", "lower", "front", "rear", "left", "right", "vertical", "horizontal", "top", "bottom", "inside" and "outside" is based on the orientation or positional relationship shown in the drawings only for convenience of description of the embodiments of the present disclosure and simplification of description rather than indicating or implying that the device or element referred to must have a particular orientation, be constructed and operate in a particular orientation, and thus are not to be construed as limiting the embodiments of the present disclosure. Furthermore, the terms "first", "second" and "third" are used for descriptive purposes only, and are not to be construed as indicating or implying relative importance.

In the description of the embodiments of the present disclosure, it should be noted that unless expressly specified and limited otherwise, the terms "connected" and "connection" should be understood broadly, e.g., may be a fixed connection, a detachable connection, or an integrated connection; may be a mechanical connection, or an electrical connection; may be a direct connection, or an indirect connection through an intermediate medium. For those of ordinary skill in the art, the specific meanings of the above terms in the present disclosure can be understood on a case-by-case basis.

In the embodiments of the present disclosure, unless expressly specified and limited otherwise, the first feature "above" or "below" the second feature may indicate that the first feature is in direct contact with the second feature, or the first feature and the second feature are in contact with each other through an intermediate medium. Moreover, the first feature "above", "on" and "over" the second feature may indicate that the first feature is directly or diagonally above the second feature, or only indicate that a horizontal height of the first feature is higher than that of the second feature. The first feature "below", "under" and "beneath" the second feature may indicate that the first feature is directly or diagonally below the second feature, or only indicate that a horizontal height of the first feature is lower than that of the second feature.

In the description of this specification, descriptions, such as reference terms "one embodiment", "some embodiments", "examples", "specific examples" or "some examples" mean that specific features, structures, materials or characteristics described in combination with this embodiment or example are included in at least one embodiment or example of the present disclosure. In this specification, the schematic representations of the above terms are not necessarily aimed at the same embodiment or example. Moreover, specific features, structures, materials or characteristics described may be combined in any one or more embodiments or examples in a suitable manner. In addition, those skilled in the art can bind and combine different embodiments or examples and features of different embodiments or examples described in this specification without contradicting each other.

Figure 2:
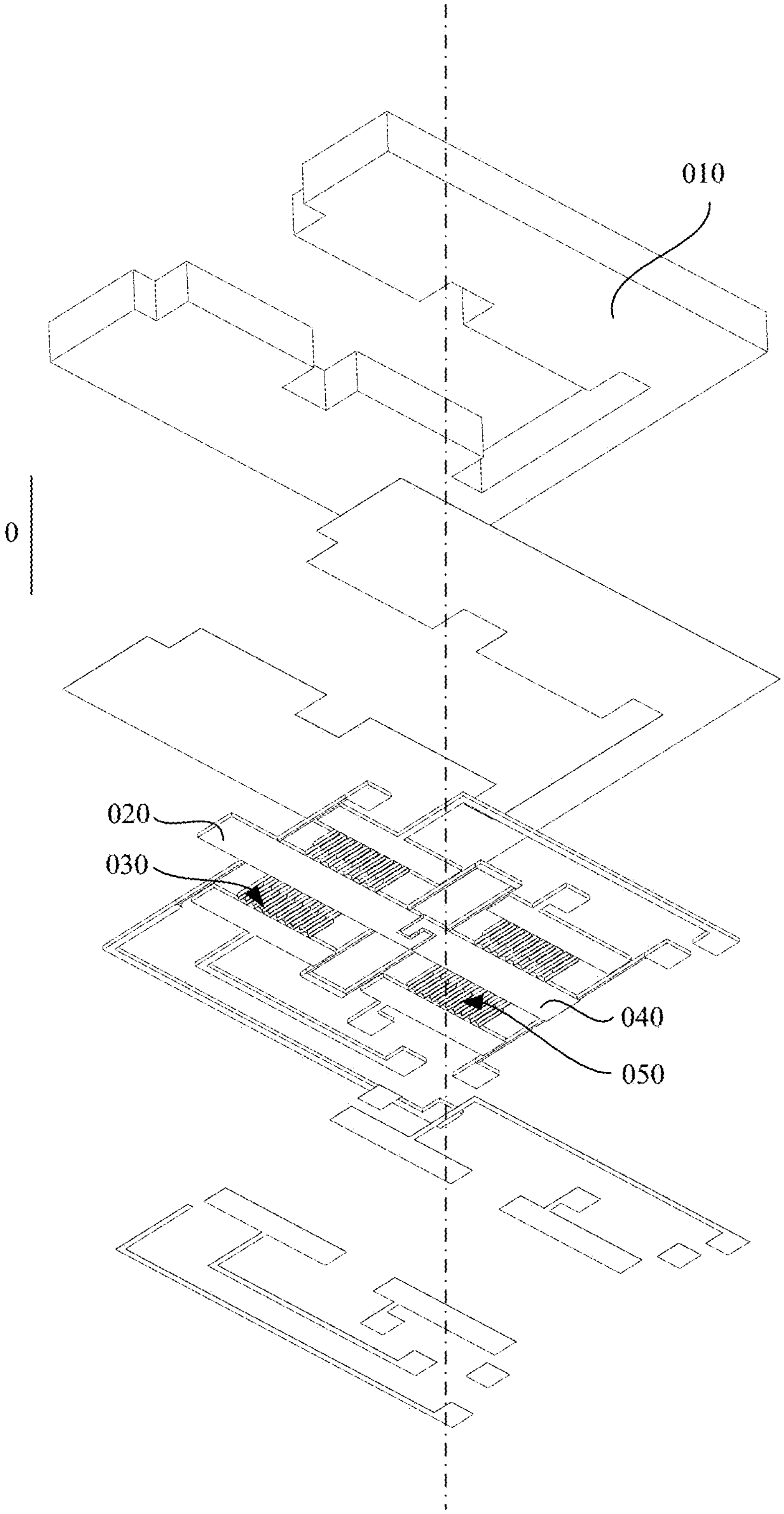
FIG. 2 is a structural exploded schematic diagram of an in-situ mechanical micro-electro-mechanical device according to an embodiment of the present disclosure.

FIG. 1 is a structural schematic diagram of an in situ mechanical micro-electro-mechanical device according to an embodiment of the present disclosure. FIG. 2 is a structural exploded schematic diagram of an in situ mechanical micro-electro-mechanical device according to an embodiment of the present disclosure.

Referring to FIG. 1 and FIG. 2, an in situ mechanical micro-electro-mechanical device provided by the present disclosure includes a base 010, a first displacement member 020, a first mechanical measurement assembly 030, a second mechanical measurement assembly 050, and a second displacement member 040.

The base 010 is provided with a first hollow-out cavity 011, a second hollow-out cavity 012, and a third hollow-out cavity 013. The third hollow-out cavity 013 is located between the first hollow-out cavity 011 and the second hollow-out cavity 012. The first displacement member 020 is arranged in the first hollow-out cavity 011 through the first mechanical measurement assembly 030, extends to the third hollow-out cavity 012, and is provided with a first sample carrying portion 021 at the extending end thereof. The second displacement member 040 is arranged in the second hollow-out cavity 012 through the second mechanical measurement assembly 050, extends to the third hollow-out cavity 013, and is provided with a second sample carrying portion 041 at the extending end thereof. The second sample carrying portion 041 is nested with the first sample carrying portion 021. One of the first displacement member 020 and the second displacement member 040 is fixed, and the other of the first displacement member 020 and the second displacement member 040 is connected to a driving component 017.

In an optional embodiment of the present disclosure, as shown in FIG. 1, the in-situ mechanical micro-electro-mechanical device is in an axisymmetric structure, that is, central axes of the first displacement member 020 and the second displacement member 040 are used as symmetrical lines. Left and right sides of the in-situ mechanical micro-electro-mechanical device are approximately symmetrically arranged. The structural stability of the in-situ mechanical micro-electro-mechanical device can be guaranteed through the geometric design of the axisymmetric structure.

The base 010 mainly supports a structure of the in-situ mechanical micro-electro-mechanical device. In an optional embodiment of the present disclosure, a thickness of the base 010 optionally ranges from 200 microns to 500 microns, for example, the base 010 with the thickness of 200 microns, 300 microns, 400 microns or 500 microns is selected. In an optional embodiment of the present disclosure, a length and width of the base 010 optionally range from 2 mm to 4 mm. For example, the base 010 with the length of 2 mm, 3 mm or 4 mm is selected, and the base 010 with the width of 2 mm, 3 mm or 4 mm is selected. The thickness, length and width of the base 010 are not specifically defined in the embodiment of the present disclosure.

A material of the base 010 may be selected from a silicon-on-insulator (SOI) sheet, a glass/silica ($SiO_2$) sheet, a lithium niobate ($LiNbO_3$) sheet, III-V semiconductor compound (such as InP, GaAs) sheet, silicon oxynitride (SiON) sheet and polymer sheet. As a specific example, a silicon-on-insulator (SOI) sheet is taken as an example in the embodiment of the present disclosure.

Specifically, in an optional embodiment of the present disclosure, the in-situ mechanical micro-electro-mechanical device can be integrally formed by a semiconductor etching technology, so that mass production can be achieved, and the consistency and yield of products can be improved.

Specifically, a preparation method for the in-situ mechanical micro-electro-mechanical device by the semiconductor etching technology may include the following steps:

In step one, the SOI sheet is used as a substrate, buffered hydrofluoric (BHF) buffer is used to remove $SiO_2$ on the surface of the SOI sheet, and a metal thin film with a metal adhesive layer is formed by carrying out magnetron sputtering on the surface.

In step two, the surface is patterned by lithography to etch out a metal conductor wire structure, and the remaining metal on the surface is etched away by a wet process.

In step three, the surface is further patterned by lithography, and reactive ion corrosion is carried out on the top silicon with plasma to form the first displacement member 020, the second displacement member 040, the first mechanical measurement assembly 030, the second mechanical measuring assembly 050, and other structures.

In step four, a back surface of the SOI sheet is patterned by overlay, and deep silicon etching is carried out to form a hollow-out structure. A buried oxide layer in the middle of the SOI sheet is removed to release all structures, thus completing the process steps to obtain the in-situ mechanical micro-electro-mechanical device.

Detailed preparation process will not be described in detail here in this embodiment of the present disclosure. It should be noted that the above preparation method for the in-situ mechanical micro-electro-mechanical device is only an optional example of the embodiment of the present disclosure, and is not a specific definition to the preparation method for the in-situ mechanical micro-electro-mechanical device provided by the present disclosure.

Figure 3:
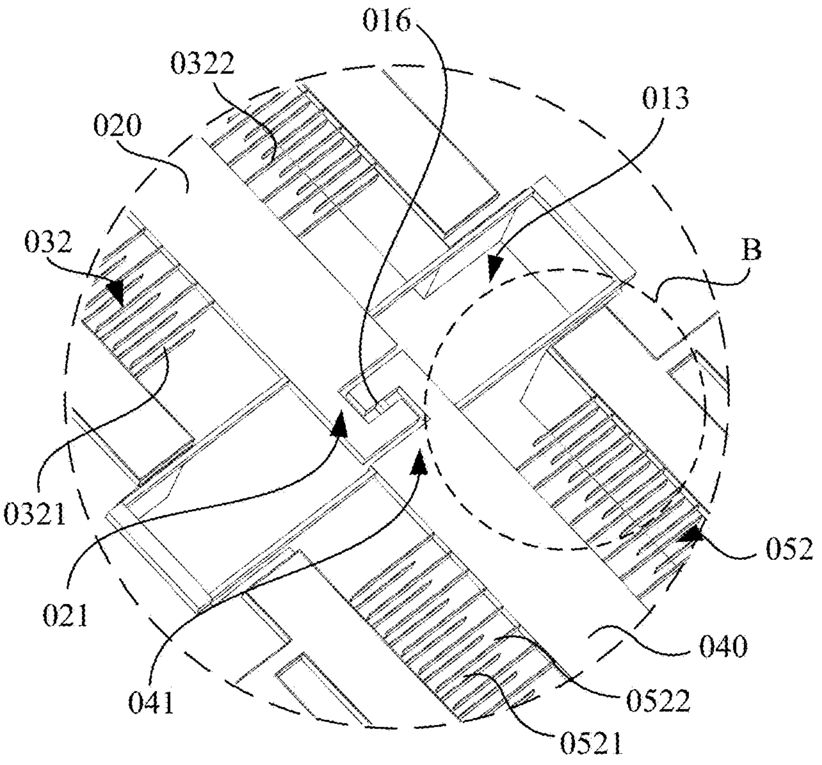
FIG. 3 is a partial enlarged structural schematic diagram of section A in FIG. 1.

FIG. 3 is a partial enlarged structural schematic diagram of section A in FIG. 1.

Referring to FIG. 1 and FIG. 3, in an optional embodiment of the present disclosure, a nested arrangement formed by the first sample carrying portion 021 and the second sample carrying portion 041 may be arranged as a set of L-shaped press-pull structure, and a sample 016 is located in a middle of the press-pull structure. In other words, the sample 016 is arranged between the first sample carrying portion 021 and the second sample carrying portion 041, and the stress transfer between the first sample carrying portion 021 and the second sample carrying portion 041 needs to be carried out through the sample 016.

Figure 4:
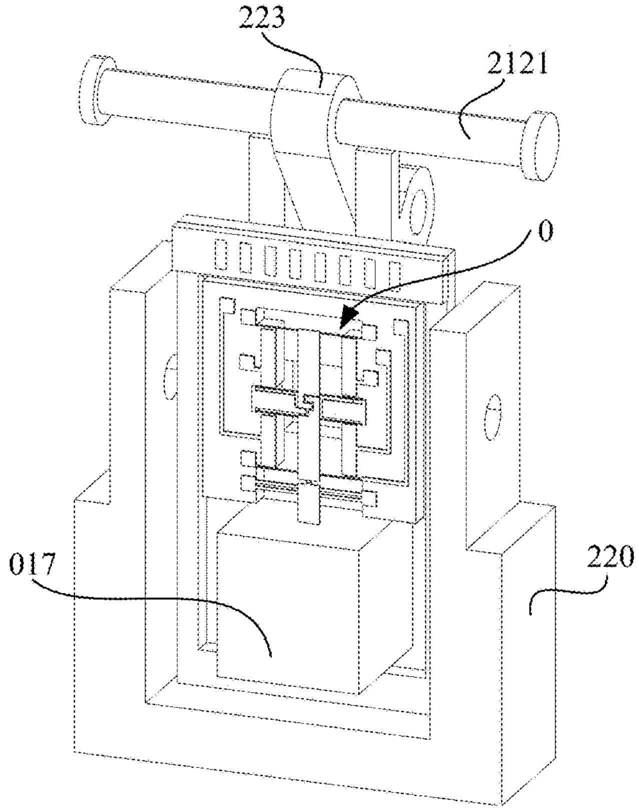
FIG. 4 is a layout schematic diagram of an in-situ mechanical micro-electro-mechanical device according to an embodiment of the present disclosure.

FIG. 4 is a layout schematic diagram of an in-situ mechanical micro-electro-mechanical device according to an embodiment of the present disclosure.

An action end of the driving component 017 is used to perform drive control on the sample 016 on the sample carrying portion 2242 in the modes, such as tension and compression step by step at the atomic scale.

Referring to FIG. 1 and FIG. 4, the driving component 017 and the first displacement member 020 or the second displacement member 040 may be fixedly connected, e.g., by instant adhesive bonding, by mutually hooking with a hook and a hanging hole, by clamping with a buckle and a slot, or by threaded connection. In an optional embodiment of the present disclosure, the driving component 017 and the first displacement member 020 or the second displacement member 040 may also be connected magnetically. For example, an electromagnet device is arranged on the driving component 017, and a magnetic substance is correspondingly arranged on one side, facing the driving component 017, of the first displacement member 020 or the second displacement member 040. A magnetic field is applied to the magnetic substance by the driving component 017 to generate attraction or repulsion, thus making the driving component 017 drive the first displacement member 020 or the second displacement member 040.

It may be understood that in the in-situ mechanical micro-electro-mechanical device provided by an embodiment of the present disclosure, one of the first displacement member 202 and the second displacement member 040 is fixedly arranged, and the other of the first displacement member 020 and the second displacement member 040 is connected to the driving component 017, so that the driving component 017 can be configured to tension or compress the first displacement member 020 or the second displacement member 040, thus applying stress to the first displacement member 020 and the second displacement member 040. Through the nested arrangement of the second sample carrying portion 041 and the first sample carrying portion 021, when the sample 016 is placed on the sample carrying portion 2242, the driving component 017 can apply various stress fields on the sample 016 based on the first sample carrying portion 021 and the second sample carrying portion 041 in nested arrangement, to tension or compress the sample 016. Furthermore, through the first mechanical measurement assembly 030 and the second mechanical measurement assembly 050 respectively connected to the first displacement member 020 and the second displacement member 040, the displacement changes of the first displacement member 020 and the second displacement member 040 and the stress on the sample 016 can be measured. By calculating a difference between the displacement of the first displacement member 020 and the displacement of the second displacement member 040, the deformation amount of the sample 016 can be obtained. Therefore, the relationship between the material atomic structure evolution and mechanical properties of the sample 016 can be fundamentally established in the TEM-based in-situ mechanical technology.

Compared with the prior art, the in-situ mechanical micro-electro-mechanical device provided by an embodiment of the present disclosure can apply various stress fields on the sample 016 by the driving device 230 based on the nested arrangement of the first displacement member 020 and the second displacement member 040. Through the first mechanical measurement assembly 030 and the second mechanical measurement assembly 050, the key mechanical property data, such as the load and deformation amount, of the sample 016 can be obtained, thus the load and deformation amount of the sample 016 can be stably measured at high mechanical resolution while characterizing the sample 016 at the atomic scale.

On the basis of the above embodiments, the difference from the above embodiments is that in an in-situ mechanical micro-electro-mechanical device provided by the present disclosure, the first mechanical measurement assembly 030 includes a first elastic support member 031, a first sensor assembly 032, and a first conductor wire assembly 033.

The first elastic support member 031 and the first sensor assembly 032 are connected to an integrated module 110 by the first conductor wire assembly 033. The first elastic support member 031 is located on a moving path of the first displacement member 020, and fixedly connected to the first displacement member 020. Both ends of the first elastic support member 031 are fixed to the base 010. The first sensor assembly 032 is arranged on at least one side of the first displacement member 020, and part of the first sensor assembly 032 is adapted to move with the first displacement member 020 to change a capacitance of the first sensor assembly 032.

Specifically, as shown in FIG. 1, both ends of the first elastic support member 031 are fixedly connected to the base 010 to support the first displacement member 020 and the part of the first sensor assembly 032 connected to the first displacement member 020, thus ensuring the stability of the first displacement member 020 and the part of the first sensor assembly 032. The first elastic support member 031 is arranged on one side, away from the first sensor assembly 032, of the first displacement member 020 in a length direction thereof, i.e., on the moving path of the first displacement member 020.

The first elastic support member 031 and the first displacement member 020 may be fixedly connected by welding. In an optional embodiment of the present disclosure, the first elastic support member 031 and the first displacement member 020 may be fixedly connected by mutually clamping with a buckle and a slot, or by threaded connection, which is not specifically limited in the embodiments of the present disclosure.

Specifically, referring to FIG. 1 to FIG. 3, in an optional embodiment of the present disclosure, the part of the first sensor assembly 032 are arranged on both sides of the first displacement member 020, that is, the part of the first sensor assembly 032 is distributed on both sides of the first displacement member 020 with a central axis of the first displacement member 020 as the symmetry axis, so that the stability of the first displacement member 020 and the part of the first sensor assembly 032 connected to the first displacement member 020 can be improved. In other optional embodiments of the present disclosure, it is also possible to arrange the part of the first sensor assembly 032 only on one side of the first displacement member 020. The specific arrangement of the part of the first sensor assembly 032 can be adaptively selected as required.

The part of the first sensor assembly 032 and the first displacement member 020 can be fabricated integrally, that is, a molten conducting material is placed in a pre-laid mold and cooled to obtain the first displacement member 020 with the part of the first sensor assembly 032. In other optional embodiments of the present disclosure, the part of the first sensor assembly 032 can be fixedly connected to the first displacement member 020 by combination mounting. For example, a mounting hole is formed in a side wall of the first displacement member 020, and a connecting rod corresponding to the mounting hole is provided on the part of the first sensor assembly 032, thus the fixed connection of part of the first sensor assembly 032 and the first displacement member 020 can be achieved by penetrating the connecting rod into the mounting hole. The part of the first sensor assembly 032 and the first displacement member 020 may also be connected by threaded connection, welding or clamping. There are various ways which can be used in fixed connection, which are not exemplified in the embodiment of the present disclosure one by one.

It may be understood that in the in-situ mechanical micro-electro-mechanical device provided by an embodiment of the present disclosure, the first sensor assembly 032 is arranged on at least one side of the first displacement member 020, such that the part of the first sensor assembly 032 can move with the first displacement member 020, the capacitance of the first sensor assembly 032 can be changed through the position change of the part of first sensor assembly 032, and the displacement change of the first displacement member 020 can be reflected through the capacitance change of the first sensor assembly 032. Both ends of the first elastic support member 031 are fixedly connected to the base 010, the first elastic support member 031 is arranged on the moving path of the first displacement member 020, and fixedly connected to the first displacement member, such that the first elastic support member 031 can support the first displacement member 020 and the part of the first sensor assembly 032 connected to the first displacement member 020 to ensure the stability of the first displacement member 020 and the part of the first sensor assembly 032.

Figure 5:
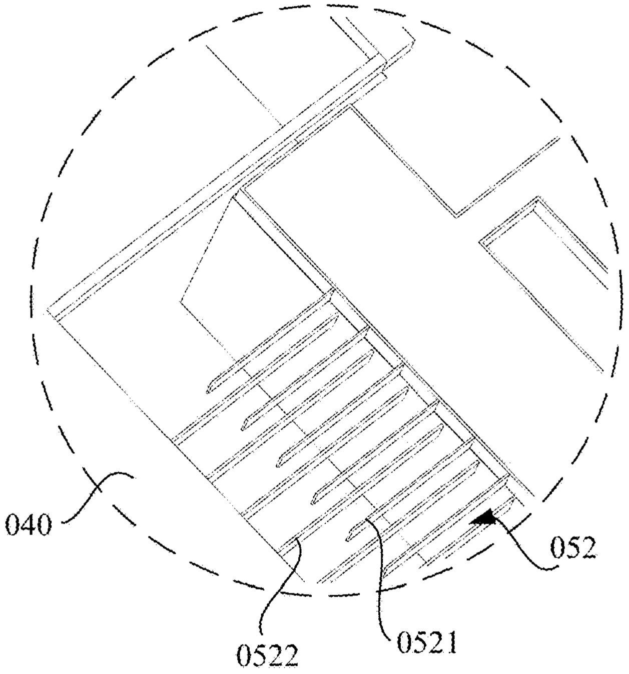
FIG. 5 is a partial enlarged schematic diagram of section B in FIG. 3.

FIG. 5 is a partial enlarged schematic diagram of section B in FIG. 3.

On the basis of the above embodiments, the difference from the above embodiments is that in an in-situ mechanical micro-electro-mechanical device provided by the present disclosure, the first sensor assembly 032 includes multiple first fixed polar plates 0321, and multiple first follow-up polar plates 0322.

As shown in FIG. 5, the multiple first follow-up polar plates 0322 are arranged on the first displacement member 020 at intervals in a moving direction of the first displacement member 020. The multiple first fixed polar plates 0321 are arranged on the base 010 at intervals in the moving direction of the first displacement member 020, and each of the first fixed polar plates 0321 is located between two adjacent first follow-up polar plates 0322.

Specifically, the number of the first follow-up polar plates 0322 and the number of the first fixed polar plates 0321 can be adaptively selected. A corresponding relationship between the first follow-up polar plate 0322 and the first fixed polar plate 0321 may be that one first follow-up polar plate 0322 corresponds to one first fixed polar plate 0321, one first follow-up polar plate 0322 corresponds to two first fixed polar plates 0321, or two first follow-up polar plates 0322 correspond to one first fixed polar plate 0321. In this embodiment, each of the first fixed polar plates 0321 is located between two adjacent first follow-up polar plates 0322, that is, one first fixed polar plate 0321 corresponds to one first follow-up polar plate 0322, which is used as a specific example for explanation.

It may be understood that in the in-situ mechanical micro-electro-mechanical device provided by the embodiment of the present disclosure, the multiple first fixed polar plates 0321 and the multiple first follow-up polar plates 0322 are arranged at intervals on the first displacement member 020 and the base 010, respectively, and are arranged in the moving direction of the first displacement member 020, so that after the first follow-up polar plates 0322 move with the first displacement member 020, the distance between the multiple first follow-up polar plates 0322 and the multiple first fixed polar plates 0321 is changed, which affects an electric field formed between the first fixed polar plate 0321 and the first follow-up polar plate 0322 and makes the capacitance of the electric field change, thus reflecting the displacement of the first displacement member 020.

Figure 6:
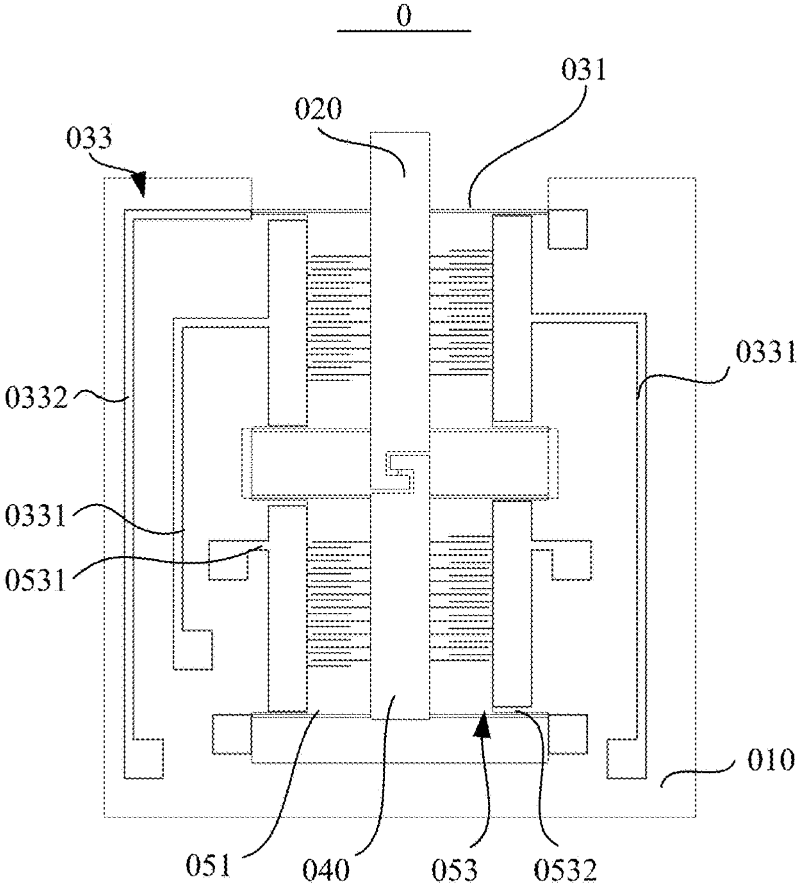
FIG. 6 is a layout schematic diagram of a first conductor wire assembly and a second conductor wire assembly of an in-situ mechanical micro-electro-mechanical device according to an embodiment of the present disclosure.

FIG. 6 is a layout schematic diagram of a first conductor wire assembly 033 and a second conductor wire assembly 053 of an in-situ mechanical micro-electro-mechanical device according to an embodiment of the present disclosure.

On the basis of the above embodiments, the different from the above embodiments is that in the in-situ mechanical micro-electro-mechanical device provided by the present disclosure, the first conductor wire assembly 033 includes a first branch conductor wire 0331, and a second branch conductor wire 0332. Referring to FIG. 1 and FIG. 6, the first branch conductor wire 0331 is connected to the multiple first fixed polar plates 0321 through a metal adhesive layer arranged on the base 010, and the second branch conductor wire 0332 is connected to the first elastic support member 031 through a pressure welding zone arranged on the base 010. Therefore, the first branch conductor wire 0331 is connected to the multiple first fixed polar plates 0321, and the second branch conductor wire 0332 is connected to the first elastic support member 031 and to the multiple first follow-up polar plates 0322, so that the insulation of the first fixed polar plates 0321 and the first follow-up polar plates 0322 can be achieved, thus providing conditions for forming the electric field between the first follow-up polar plate 0322 and the first fixed polar plate 0321.

On the basis of above embodiments, the difference from above embodiments is that in the in-situ mechanical micro-electro-mechanical device provided by the present disclosure, referring to FIG. 1, the second mechanical measurement assembly 050 includes a second elastic support member 051, a second sensor assembly 052, and a second conductor wire assembly 053. The second elastic support member 051 and the second sensor assembly 052 are connected to the integrated module 110 through the second conductor wire assembly 053.

The second sensor assembly 051 is located on a moving path of the second displacement member 040, and fixedly connected to the second displacement member 040. Both ends of the second elastic support member 051 are fixed to the base 010. The second sensor assembly 052 is arranged on at least one side of the second displacement member 040, and part of the second sensor assembly 052 is adapted to move with the second displacement member 040 to change a capacitance of the second sensor assembly 052.

The specific arrangement of the second elastic support 051, the second sensor assembly 052 and the second conductor wire assembly 053 can refer to the specific arrangement of the first elastic support member 031, the first sensor assembly 032 and the first conductor wire assembly 033 described above, and thus will not be described here again.

It may be understood that in the in-situ mechanical micro-electro-mechanical device provided by an embodiment of the present disclosure, the second sensor assembly 052 is arranged on at least one side of the second displacement member 040, such that the part of the second sensor assembly 052 can move with the second displacement member 040. The capacitance of the second sensor assembly 052 can be changed through the position change of the part of second sensor assembly 052. The displacement change of the second displacement member 040 can be reflected through the capacitance change of the second sensor assembly 052. Both ends of the second elastic support member 051 are fixedly connected to the base 010, the second elastic support member 051 is arranged on the moving path of the second displacement member 040, and fixedly connected to the second displacement member, such that the second elastic support member 051 can support the second displacement member 040 and the part of the second sensor assembly 052 connected to the second displacement member 040 to ensure the stability of the second displacement member 040 and the part of the second sensor assembly 052.

On the basis of the above embodiments, the difference from the above embodiments is that in an in-situ mechanical micro-electro-mechanical device provided by the present disclosure, the second sensor assembly 052 includes multiple second fixed polar plates 0521, and multiple second follow-up polar plates 0522.

As shown in FIG. 1, FIG. 3 and FIG. 5, the multiple second follow-up polar plates 0522 are arranged on the second displacement member 040 at intervals in a moving direction of the second displacement member 040. The multiple second fixed polar plates 0521 are arranged on the base 010 at intervals in the moving direction of the second displacement member 040, and each of the second fixed polar plates 0521 is located between two adjacent second follow-up polar plates 0522.

Specifically, the specific arrangement of the multiple second fixed polar plates 0521 and the multiple second follower polar plates 0522 may refer to the specific arrangement of the multiple first fixed polar plates 0321 and the multiple first follower polar plates 0322 described above, and thus will not be described here again.

It may be understood that in the in-situ mechanical micro-electro-mechanical device provided by the embodiment of the present disclosure, the multiple second follow-up polar plates 0522 and the multiple second fixed polar plates 0521 are arranged at intervals on the second displacement member 040 and the base 010, respectively, and are arranged in the moving direction of the second displacement member 040, so that after the second follow-up polar plates 0522 move with the second displacement member 040, the distance between the multiple second follow-up polar plates 0522 and the multiple second fixed polar plates 0521 is changed, which affects an electric field formed between the second fixed polar plate 0521 and the second follow-up polar plate 0522 and makes the capacitance of the electric field change, thus reflecting the displacement of the second displacement member 040.

On the basis of the above embodiments, the difference from the above embodiments is that in an in-situ mechanical micro-electro-mechanical device provided by the present disclosure, the second conductor wire assembly 053 includes a third branch conductor wire 0531, and a fourth branch conductor wire 0532.

Referring to FIG. 1 and FIG. 6, the third branch conductor wire 0531 is connected to the multiple second fixed polar plates 0521 through the metal adhesive layer arranged on the base 010, and the fourth branch conductor wire 0532 is connected to the second elastic support member 051 through the pressure welding zone arranged on the base 010. Therefore, the third branch conductor wire 0531 is connected to the multiple second fixed polar plates 0521, and the fourth branch conductor wire 0332 is connected to the second elastic support member 051 and to the multiple second follow-up polar plates 0522, so that the insulation of the second fixed polar plates 0521 and the second follow-up polar plates 0522 can be achieved, thus providing conditions for forming the electric field between the second follow-up polar plate 0522 and the second fixed polar plate 0521.

On the basis of the above embodiments, the difference from the above embodiments is that in an in-situ mechanical micro-electro-mechanical device provided by the present disclosure, the first elastic support member 031 is fixed to the moving path of the first displacement member 020, the second elastic support member 051 is fixed to the moving path of the second displacement member 040, and the first elastic support member 031 and the second elastic support member 051 are fixedly connected to the base 010, so that the stability of the first displacement member 020, the second displacement member 040, the first mechanical measurement assembly 030 and the second mechanical measurement assembly 050 distributed in the first hollow-out cavity 011, the second hollow-out cavity 012 and the third hollow-out cavity 013 can be ensured. The first mechanical measurement assembly 030 and the second mechanical measurement assembly 050 are respectively arranged on both sides of the nested arrangement formed by the first sample carrying portion 021 and the second sample carrying portion 041, so that the displacement changes of the first displacement member 020 and the second displacement member 040 respectively on both ends of the sample 016 can be measured simultaneously. In addition, the first mechanical measurement assembly 030 and the second mechanical measurement assembly 050 are symmetrically arranged with respect to the sample 016, thus ensuring the stability of the structure.

On the basis of the above embodiments, the difference from the above embodiments is that in an in-situ mechanical micro-electro-mechanical device provided by the present disclosure, the first elastic support member 031 and/or the second elastic support member 051 may specifically be an elastic fixed support beam, and made of a semiconductor material with a specific orientation and known Young's modulus. In this way, a stiffness coefficient of the first elastic support member 031 and/or the second elastic support member 051 can be calculated, on basis of this and in combination with the displacement change of the first displacement member 020 and/or the second displacement member 040 measured by the first sensor assembly 032 and/or the second sensor assembly 052, an elastic force on the first elastic support member 031 and/or the second elastic support member 051 can be obtained according to Hooke's law. It may be understood that this elastic force and the stress on the sample 016 are a pair of action and reaction. According to Newton's third law, the stress on the sample 016 can be measured according to the elastic force on the first elastic support member 031 and/or the second elastic support member 051.

In an optional embodiment, each of the first conductor wire assembly 033 and the second conductor wire assembly 053 may be a metal conductor wire, e.g., a copper conductor wire, an aluminum conductor wire, or a silver conductor wire, which is not specifically defined in the embodiment of the present disclosure.

In an optional embodiment of the present disclosure, the displacement of the first sensor assembly 032 and the second sensor assembly 052 can be measured by the three-electrode method, and the change of a differential capacitance with the first displacement member 020 and/or the second displacement member 040 can be directly measured by the three-electrode method. Further, the capacitance-displacement sensitivity can be greatly improved by reasonably designing the polar plate spacing between the fixed polar plate and the follow-up polar plate and distribution form of the fixed polar plate and the follow-up polar plate. In an optional embodiment of the present disclosure, three-electrode conductor wire channels, i.e., between each two of the first branch conductor wire 0331, the second branch conductor wire 0332, the third branch conductor wire 0531 and the fourth branch conductor wire 0532, are designed with large-size isolation channels higher than 100 μm, so as to reduce signal interference between conductor wires by increasing the spacing between the conductor wires and achieve performance advantages of low noise and strong stability.

The first sensor assembly 032 and the second sensor assembly 052 adopted in the embodiment of the present disclosure have the characteristics of low thermal noise, mature technology, and the like. The position changes of the first displacement member 020 and the second displacement member 040 can be stably sensed out after being energized, and then the deformation amount of the sample 016 can be measured.

In an optional embodiment, each of the external length and external width of the first sensor assembly 032 and the second sensor assembly 052 ranges from 1000 μm to 2000 μm. For example, the first sensor assembly 032 and the second sensor assembly 052 with an external length of 1000

μm, 1500 μm or 2000 μm are selected, and the first sensor assembly 032 and the second sensor assembly 052 with an external width of 1000 μm, 1500 μm for 2000 μm are selected. The external thickness of the first sensor assembly 032 and the second sensor assembly 052 ranges from 10 μm to 80 μm. For example, the first sensor assembly 032 and the second sensor assembly 052 with an external thickness of 10 μm, 20 μm, 40 μm, 60 μm or 80 μm are selected. It should be noted here that the external length, external width and external thickness of the first sensor assembly 032 may be different from that of the second sensor assembly 052, and specifically, the external length, the external width and the external thickness of each of the first sensor assembly 032 and the second sensor assembly 052 may be adaptively selected as required.

On the basis of the above embodiments, when the in-situ mechanical micro-electro-mechanical device provided by the present disclosure is used specifically, such as in the TEM-based quantitative in-situ tensile experiment, the sample 016 can use one-dimensional materials, two-dimensional materials, bulk materials and the like prepared by the focused ion beam technology (FIB), the sample 016 is placed on the nested arrangement of the second sample carrying portion 041 and the first sample carrying portion 021. When the driving component 017 is turned on, the first displacement member 020 moves towards the second displacement member 040, that is, displacement of the first displacement member 020 is generated, so that the spacing between the multiple first follow-up plates 0322 and the multiple first fixed plates 0321 of the first sensor assembly 032 changes at equal displacement, and then the change of the capacitance output by the first sensor assembly 32 can reflect the displacement of the first displacement member 020. Meanwhile, the second displacement member 040 is driven by the sample 016 to generate the displacement in the same moving direction of the first displacement member 020, and the spacing between the first sample carrying portion 021 of the first displacement member 020 and the second sample carrying portion 041 of the second displacement member 040 becomes larger, that is, the sample 016 is elongated. The spacing between the multiple second follow-up polar plates 0522 and the multiple second fixed polar plates 0521 of the second sensor assembly 052 changes, and the change of the capacitance output by the second sensor assembly 052 can reflect the displacement of the second displacement member 040. Further, by calculating the difference between the displacement of the first displacement member 020 and the displacement of the second displacement member 040, the deformation amount of the sample 016 can be obtained. According to Hooke's law, the stress on the sample 016 can be obtained by multiplying the displacement amount of the second displacement member 040 with the stiffness coefficient of the second elastic support member 051.

Figure 7:
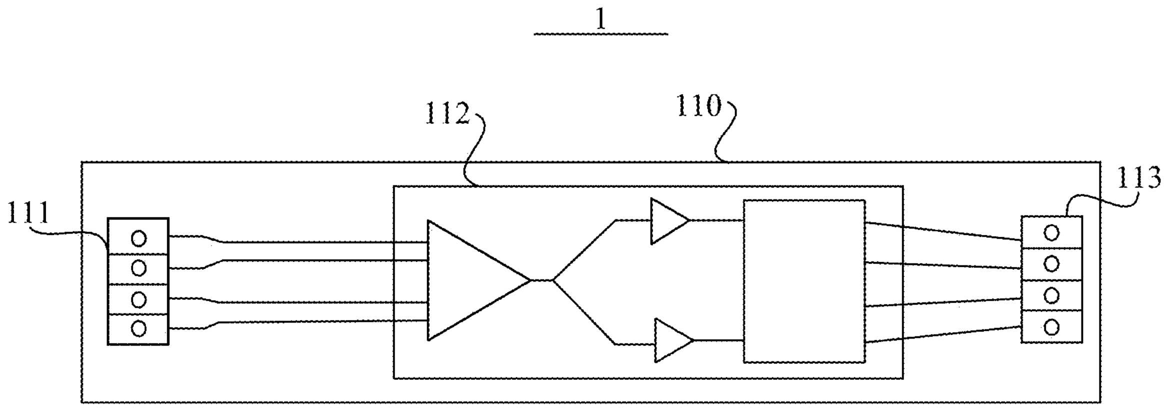
FIG. 7 is a schematic diagram of an integrated module of an in-situ mechanical micro-electro-mechanical system according to an embodiment of the present disclosure.
Figure 8:
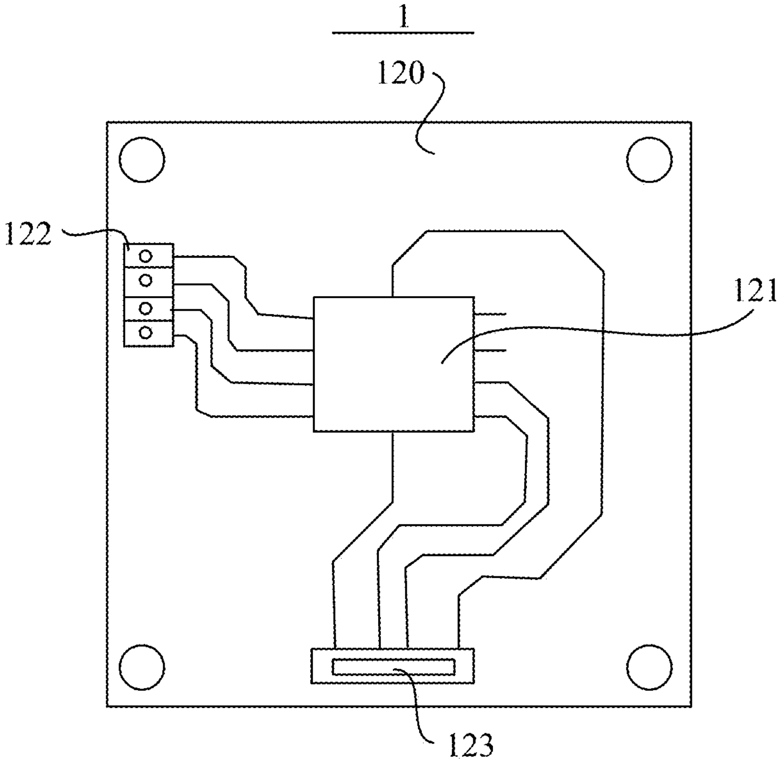
FIG. 8 is a schematic diagram of a signal acquisition module of an in-situ mechanical micro-electro-mechanical system according to an embodiment of the present disclosure.

FIG. 7 is a schematic diagram of an integrated module 110 of an in-situ mechanical micro-electro-mechanical system according to an embodiment of the present disclosure. FIG. 8 is a schematic diagram of a signal acquisition module 120 in an in-situ mechanical micro-electro-mechanical system according to an embodiment of the present disclosure.

The in-situ mechanical micro-electro-mechanical system provided by the present disclosure, referring to FIG. 7 and FIG. 8, includes an integrated module 110, a signal acquisition module 120, and the in-situ mechanical micro-electro-mechanical device of any embodiment described above. The integrated module 110 is electrically connected to the in-situ mechanical micro-electro-mechanical device via a first flexible conductor wire 130. The integrated module 110 is electrically connected to the signal acquisition module 120 via a second flexible conductor wire. Therefore, a capacitance signal acquired by the first sensor assembly 032 and the second sensor assembly 052 can be transmitted to the integrated module 110 through the first flexible conductor wire 130, then the capacitance signal can be converted into a voltage signal by the integrated module 110, then the voltage signal is converted into a digital signal, and then the digital signal is transmitted to the signal acquisition module 120 through the second flexible conductor wire. In this way, the signal intercommunication of the in-situ mechanical micro-electro-mechanical system can be achieved, and in addition, the whole in-situ mechanical micro-electro-mechanical system can be reversely powered by the signal acquisition module 120.

On the basis of the above embodiments, the difference from the above embodiments is that in an in-situ mechanical micro-electro-mechanical system provided by the present disclosure, referring to FIG. 7, the integrated module 110 includes multiple capacitance acquisition interfaces 111, a capacitance acquisition-conversion circuit 112, and signal output interfaces 113 which are connected to one another. The multiple capacitance acquisition interfaces 111 are connected to the in-situ mechanical micro-electro-mechanical device via the first flexible conductor wire 130, and the signal output interfaces 113 are connected to the signal acquisition module 120 via the second flexible conductor wire.

Specifically, the integrated module 110 may be fabricated by a printed circuit board (PCB), the PCB employs a double-sided copper-clad plate with a thickness less than or equal to 0.5 mm for processing, and circuit protection is carried out on the surface of the copper-clad plate by solder mask process. The circuit board diagram of the integrated module 100 can be designed using circuit board drawing software.

As shown in FIG. 7, the capacitance acquisition-conversion circuit 112 is arranged between the multiple capacitance acquisition interfaces 111 and the signal output interfaces 113, the capacitance acquisition-conversion circuit 112 are electrically connected to the multiple capacitance acquisition interfaces 111 and the signal output interfaces 113 through preset circuits on the PCB. The multiple capacitance acquisition interfaces 111 are arranged side by side, and the adjacent capacitance acquisition interfaces 111 are insulated from each other to ensure that the capacitance signals do not interfere with each other. The layout of the signal output interfaces 113 can refer to the layout of the multiple capacitance acquisition interfaces 111. The multiple capacitance acquisition interfaces 111 and the signal output interfaces 113 can be externally connected by flexible PCB connectors, such as flexible conductor wires.

Specifically, the multiple capacitance acquisition interfaces 111 receive capacitance signals transmitted from the first sensor assembly 032 and the second sensor assembly 052 in the in-situ mechanical micro-electro-mechanical device through the flexible conductor wires. Further, the multiple capacitance acquisition interfaces 111 transmit the capacitance signals to the capacitance acquisition-conversion circuit 112 via internal circuits of the PCB; the capacitance signals are converted into voltage signals by the capacitance acquisition-conversion circuit 112, then the voltage signals are converted into digital signals and then the digital signals are transmitted to the signal output interfaces 113 via internal circuits of the PCB. Further, the digital signals are transmitted by the signal output interfaces 113 to the signal acquisition module 120 via the flexible conductor wires.

It may be understood that in the in-situ mechanical micro-electro-mechanical system provided by an embodiment of the present disclosure, the multiple capacitance acquisition interfaces 111 are connected to the in-situ mechanical micro-electro-mechanical device by the first flexible conductor wire 130. Therefore, when the first displacement member 020 and the second displacement member 040 move, the first sensor assembly 032 and the second sensor assembly 052 can transmit capacitance signals reflecting the displacement changes of the first displacement member 020 and the second displacement member 040 to the integrated module 110, and then the capacitance signals can be converted into digital signals by the capacitance acquisition-conversion circuit 112 in the integrated module 110. In addition, the signal output interfaces 113 are connected to the signal acquisition module 120 through the second flexible conductor wire. Therefore, the signal intercommunication and operation of the in-situ mechanical micro-electro-mechanical system can be achieved by transmitting the digital signals converted by the integrated module 110 to the signal acquisition module 120.

On the basis of the above embodiments, the difference from the above embodiments is that in an in-situ mechanical micro-electro-mechanical system provided by the present disclosure, referring to FIG. 8, the signal acquisition module 120 includes a single chip microcomputer 121, and signal acquisition interfaces 122 and a serial communication interface 123 connected to the single chip microcomputer 121. The signal acquisition interfaces 122 are connected to the signal output interface 113 through the second flexible conductor wire.

Specifically, the signal acquisition module 120 may also be fabricated from a printed circuit board, and its preparation method is similar to that of the integrated module 110, and thus will not be described in detail in the embodiment of the present disclosure. As shown in FIG. 4, the single chip microcomputer 121 is located at the center of the PCB, and the signal acquisition interfaces 122 and the serial communication interface 123 are electrically connected to the single chip microcomputer 121 through preset circuits on the PCB. The single chip microcomputer 121 is fixedly connected to the PCB by welding, and can receive digital signals transmitted by the signal acquisition interfaces 122 to achieve signal acquisition. Further, the single chip microcomputer 121 communicates with external devices and software through the serial communication interface 123 connected thereto, and the serial communication interface 123 can also achieve the power supply function to the internal circuits. In an optional embodiment of the present disclosure, the signal acquisition interfaces 122 may also achieve signal connection of the integrated module 100 and the single chip microcomputer 121 by a wire-to-board connector.

Figure 9:
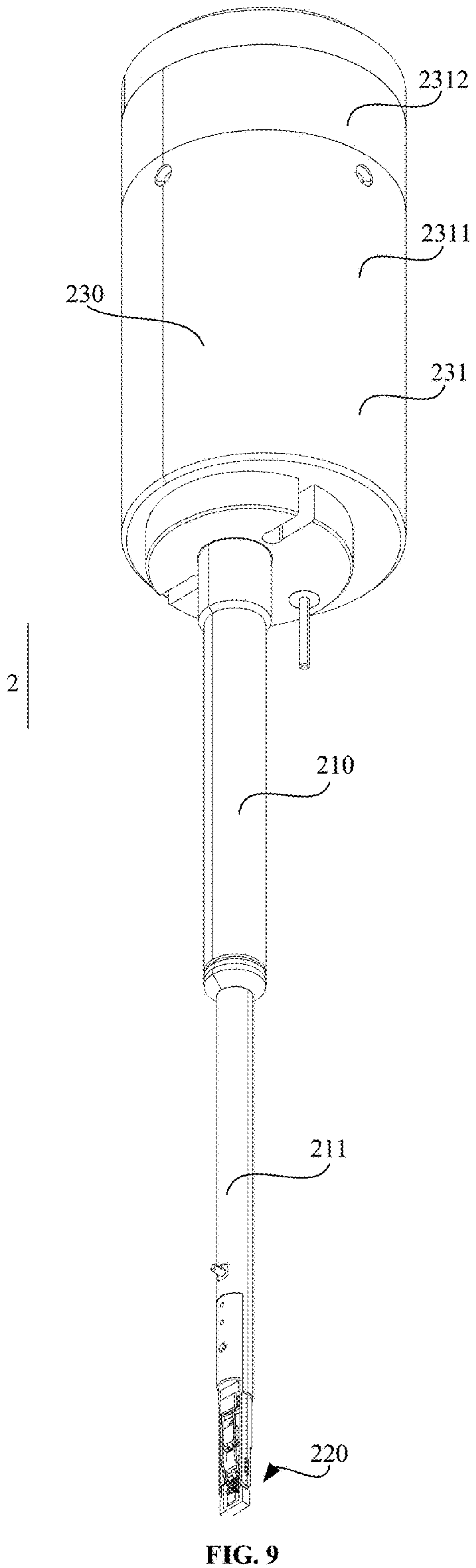
FIG. 9 is a schematic diagram of an overall structure of a double-tilt sample holder according to an embodiment of the present disclosure.
Figure 10:
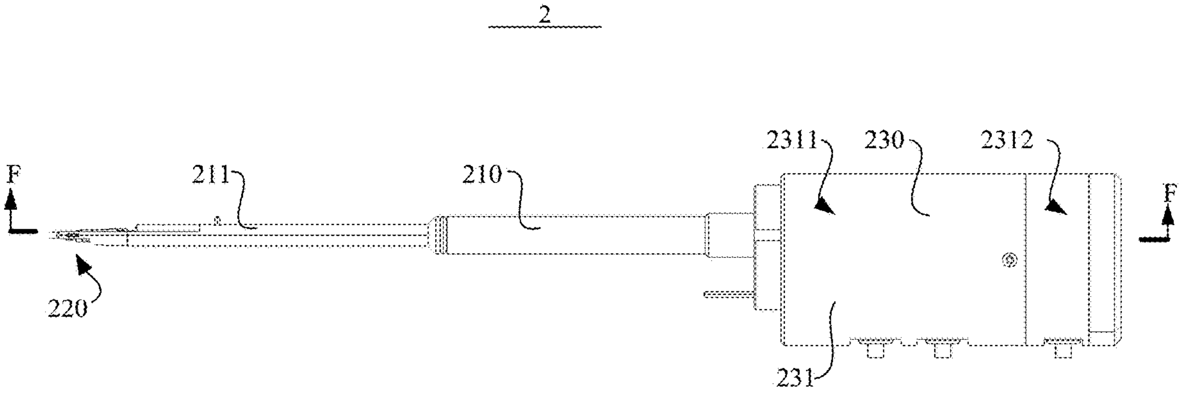
FIG. 10 is a front view of a double-tilt sample holder according to an embodiment of the present disclosure.
Figure 11:
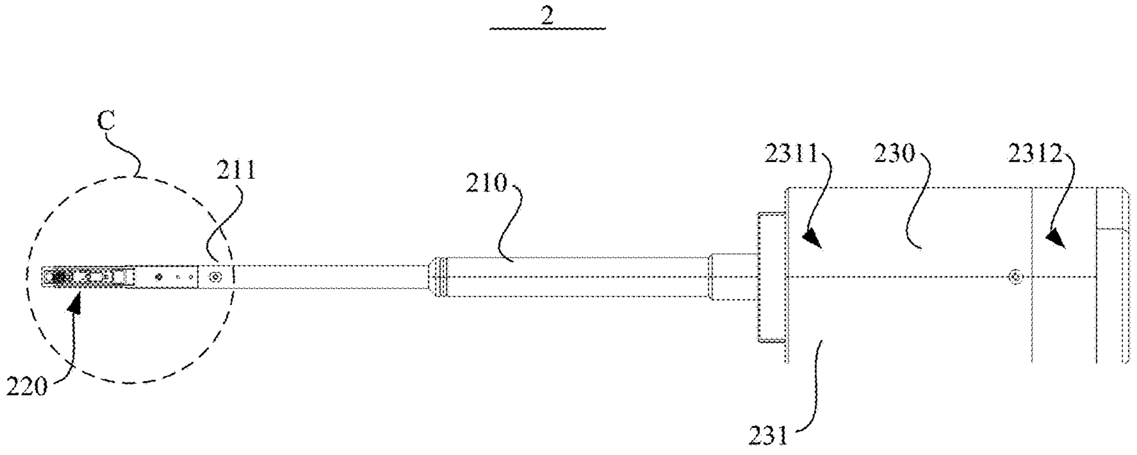
FIG. 11 is a top view of a double-tilt sample holder according to an embodiment of the present disclosure.
Figure 12:
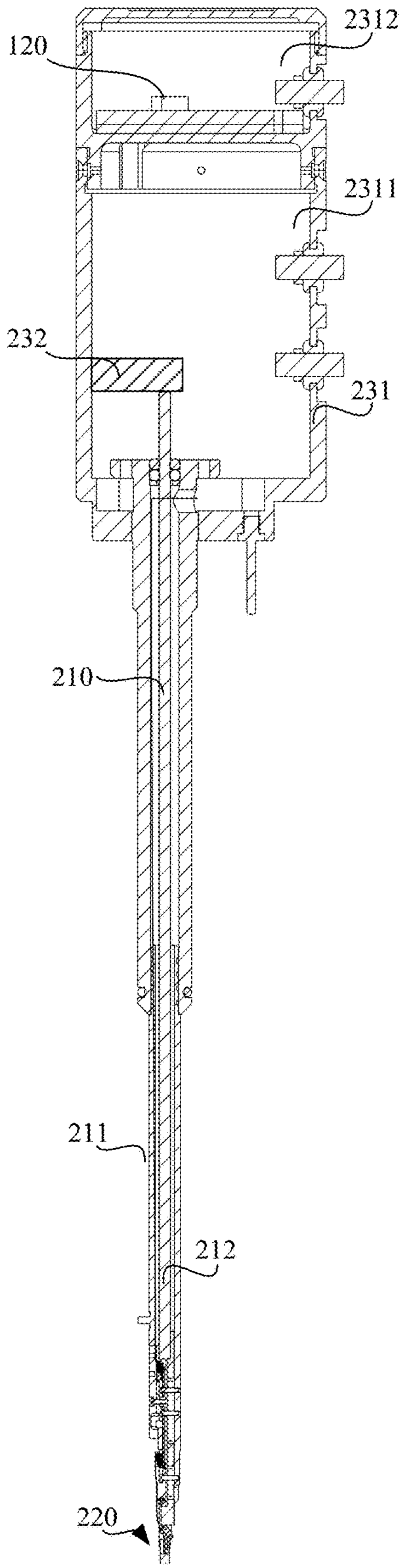
FIG. 12 is a sectional diagram of FIG. 10 taken along line F-F.

FIG. 9 is a schematic diagram of an overall structure of a double-tilt sample holder according to an embodiment of the present disclosure. FIG. 10 is a front view of a double-tilt sample holder according to an embodiment of the present disclosure. FIG. 11 is a top view of a double-tilt sample holder according to an embodiment of the present disclosure. FIG. 12 is a sectional diagram of FIG. 10 taken along line F-F.

The present disclosure further provides a double-tilt sample holder which is used based on TEM, including a driving device 230, a rod body 210, a tilting table 220, and the in-situ mechanical micro-electro-mechanical systems of any embodiment described above.

The rod body 210 includes a supporting body 211, and a driving rod 212. Referring to FIG. 9, FIG. 10, FIG. 11 and FIG. 12, the supporting body 211 is provided with a hollow cavity, that is, the inside of the rod body of the supporting body 211 is a hollow cavity, the driving rod 212 penetrates through the hollow cavity, and one end of the driving rod 212 is connected to the driving device 230, and is adapted to reciprocate along an inner wall of the hollow cavity under the action of the driving device 230. The tilting table 220 is rotatably connected to the supporting body 211, hinged with the driving rod 212, and is adapted to move with the driving rod 212 for being tilted. Various components of the in-situ mechanical micro-electro-mechanical system are arranged on the tilting table 220, the rod body 210 and the driving device 230, respectively.

Figure 13:
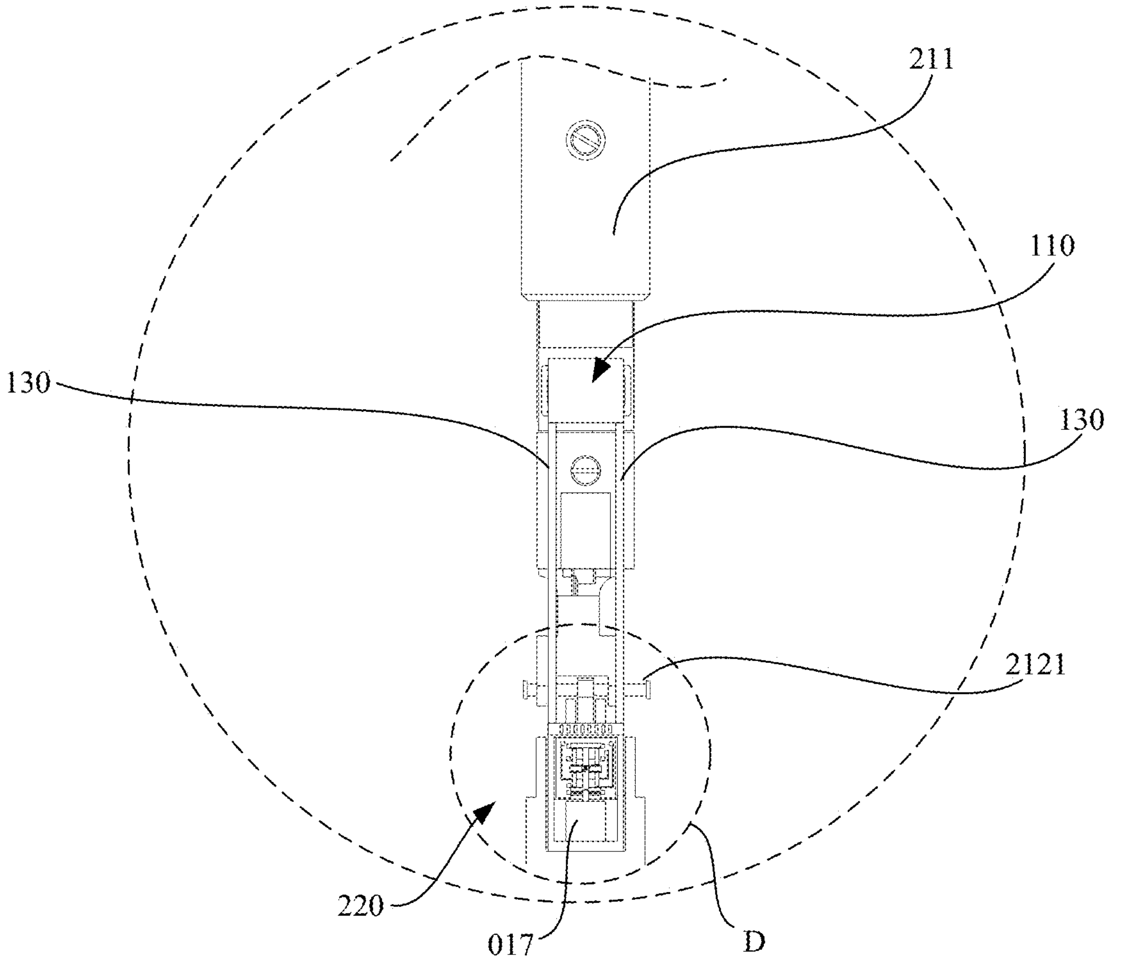
FIG. 13 is a partial enlarged structural schematic diagram of section C in FIG. 11.
Figure 14:
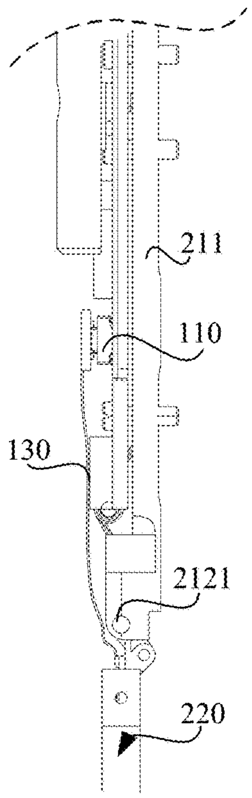
FIG. 14 is a right view of FIG. 13.
Figure 15:
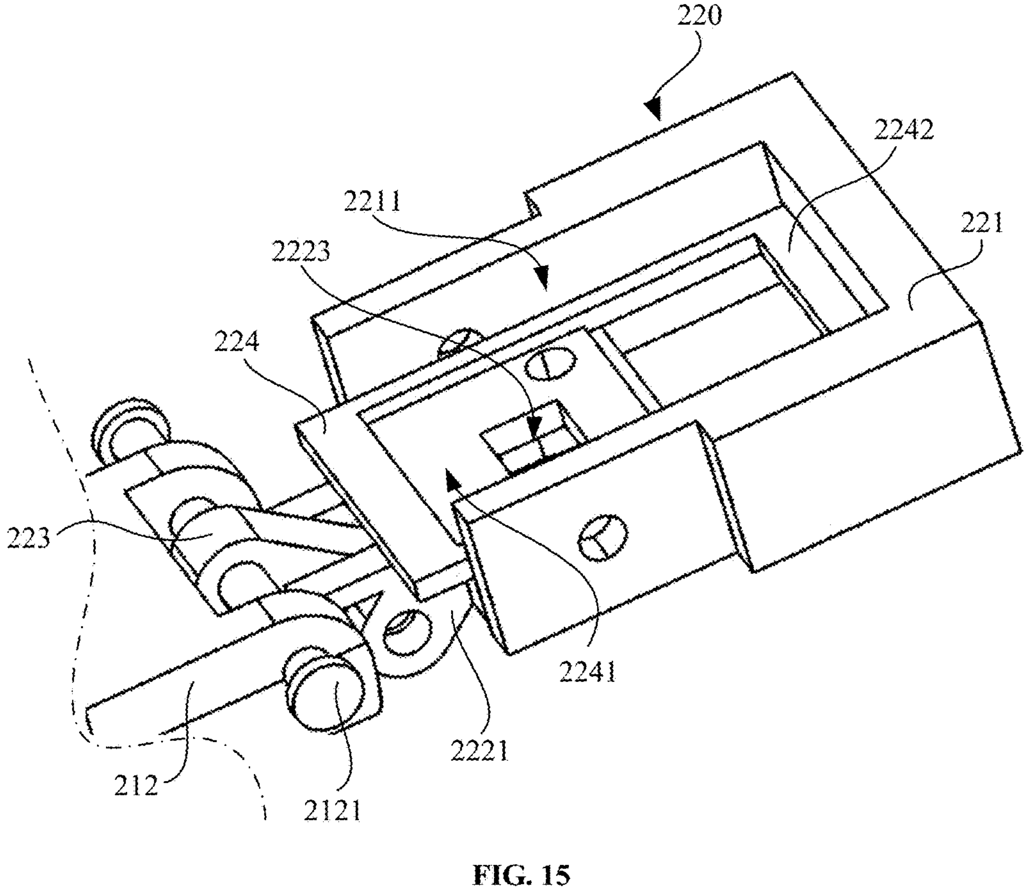
FIG. 15 is a connection schematic diagram of a tilting table of a double-tilt sample holder according to an embodiment of the present disclosure.

FIG. 13 is a partial enlarged structural schematic diagram of section C in FIG. 11. FIG. 14 is a right view of FIG. 13. FIG. 15 is a connection schematic diagram of a tilting table 220 of a double-tilt sample holder according to an embodiment of the present disclosure.

As shown in FIG. 13, FIG. 14 and FIG. 15, a front end of the supporting body 211 is rotatably connected to the tilting table 220, a rear end of the tilting table 220 is rotatably connected to a front end of the driving rod 212, that is, the rear end of the tilting table 220 is hinged with the front end of the driving rod 212. The driving device 230 reciprocates in an axial direction of the driving rod 212 to tilt the tilting table 220.

Figure 16:
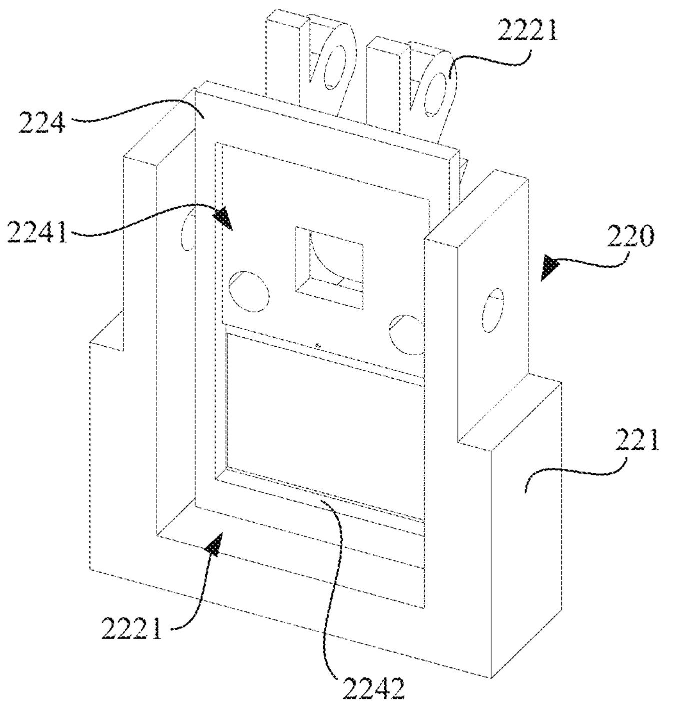
FIG. 16 is a structural schematic diagram of a tilting table of a double-tilt sample holder according to an embodiment of the present disclosure.
Figure 17:
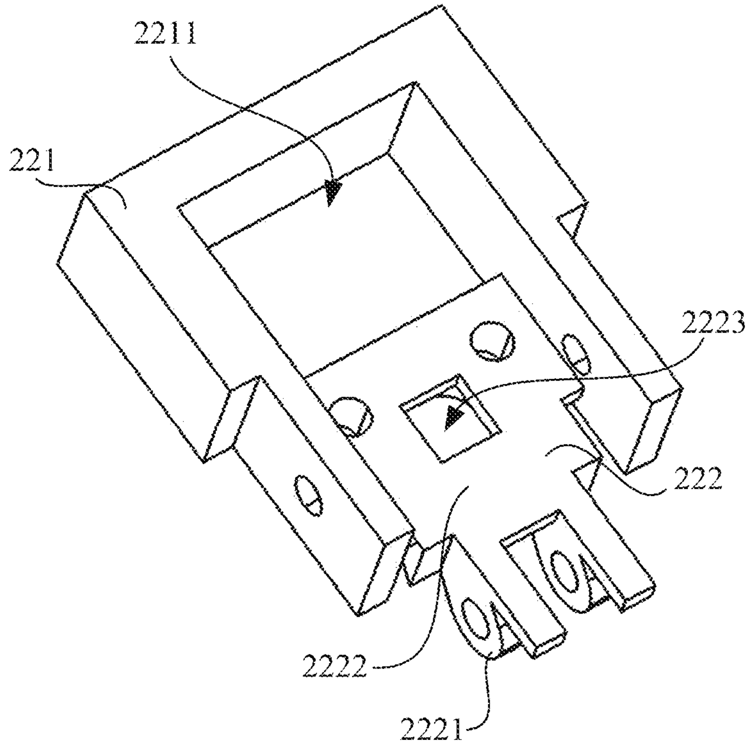
FIG. 17 is a structural schematic diagram of a tilting table of a double-tilt sample holder according to an embodiment of the present disclosure viewed in another direction.

FIG. 16 is a schematic structural diagram of a tilting table 220 of a double-tilt sample holder according to an embodiment of the present disclosure. FIG. 17 is a structural schematic diagram of a tilting table 220 of a double-tilt sample holder according to an embodiment of the present disclosure viewed in another direction.

On the basis of the above embodiments, the difference from the above embodiments is that in a double-tilt sample holder provided by the present disclosure, referring to FIG. 16 and FIG. 17, the tilting table 220 includes a tilting body 221, a mounting table 222, a connecting rod 223, and a carrying member 224.

As shown in FIG. 17, the tilting body 221 is provided with a U-shaped tilting slot 2211, the mounting table 222 is located in the tilting slot 2211, and rotatably connected to the tilting body 221. As shown in FIG. 15, a second rotating end of the connecting rod 223 is rotatably connected to the mounting table 222, and a first rotating end of the connecting rod 223 is rotatably connected to the driving rod 212. The carrying member 224 is fixedly arranged on the mounting table 222, and provided with a carrying cavity 2241. As shown in FIG. 4 and FIG. 16, the in-situ mechanical micro-electro-mechanical device of the in-situ mechanical micro-electro-mechanical system is embedded into the carrying cavity 2241.

Specifically, as shown in FIG. 13 and FIG. 16, a group of rotating shaft holes can be symmetrically formed in both sides of the U-shaped tilting slot 2211, and a rotatable connection between the front end of the supporting body 211 and the U-shaped tilting slot 2211 of the tilting table 220 can be achieved through a rotating shaft penetrating through the front end of the supporting body 211 and the rotating shaft holes; the rear end of the tilting table 220 is rotatably connected to the front end of the driving rod 212, the driving mechanism reciprocates in an axial direction of the driving rod 212 to tilt the mounting table 222 of the tilting table 220.

As shown in FIG. 17, through holes are formed in the carrying member 224, and the mounting table 222 is provided with screw holes corresponding to the through holes. As shown in FIG. 16, the centers of the through holes and the screw holes are first aligned, such that the carrying member 224 and the mounting table 222 can be fixedly connected by screws. It should be noted here that the connection mode of the carrying member 224 and the mounting table 222 described above is only an optional example of the embodiment of the present disclosure and is not used as a specific defined of the embodiment of the present disclosure.

In an optional embodiment of the present disclosure, referring to FIG. 17, the mounting table 222 may also include an inclined portion 2221, and a horizontal portion 2222. An electron beam through hole 2223 may be formed in the horizontal portion 2222. Therefore, a high-energy electron beam emitted by TEM can pass through the electron beam through hole 2223, and then pass through the carrying member 224 to contact with the sample loaded in the in-situ mechanical micro-electro-mechanical device on the carrying member 224, thus achieving the characterization of the sample material at the atomic scale. A tilting through hole is formed in the inclined portion 2221 of the mounting table 222, and the tilting through hole is rotatably connected to the second rotating end of the connecting rod 223. Therefore, during the linear reciprocating movement of the driving rod 212, the transmission mechanism of the connecting rod 223 cooperates with a tilting shaft to achieve the rotation of the horizontal portion 2222 of the mounting table 222.

In an optional embodiment of the present disclosure, the driving component 017 in the in-situ mechanical micro-electro-mechanical device may be a small-size micro driver which can achieve precise step driving in a sub-angstrom level. Specifically, as shown in FIG. 4, a fixed end of the driving component 017 may be bonded to the carrying portion 2242 of the carrying member 224 through instant adhesive, and the action end of the driving component 017 is also bonded to the first displacement member 020 or the second displacement member 040 in the in-situ mechanical micro-electro-mechanical device through instant adhesive.

Referring to FIG. 14, the integrated module 110 of the in-situ mechanical micro-electro-mechanical system can be arranged on the carrying member 224 through fasteners such as bolts or screws, and the capacitance acquisition interface 111 at a front end of the integrated module 110 is electrically connected to the pressure welding zone in the in-situ mechanical micro-electro-mechanical device through the first flexible conductor wire 130, thus ensuring that there is no interference between the connection of the integrated module 110 and the in-situ mechanical micro-electro-mechanical device and the tilting movement of the tilting table 220. The signal acquisition module 120 of the in-situ mechanical micro-electro-mechanical system is arranged on the driving device 230, and the signal acquisition interfaces 122 of the signal acquisition module 120 is electrically connected to the signal output interfaces 113 at a rear end of the integrated module 110 through the second flexible conductor wire, thus ensuring that there is no interference between the connection of the integrated module 110 and the signal acquisition module 120 and the movement of the driving rod 212.

When the double-tilt sample holder provided by the embodiment of the present disclosure is used, the double-tilt sample holder can be inserted into TEM, the parameters of TEM can be adjusted into an optimal imaging state, and the driving rod 212 is controlled to reciprocate linearly in an axial direction of the rod body 210 by the driving device 230 to achieve the rotation of the mounting table 222 about the tilting shaft, so that the sample 016 is adjusted to a low-index positive zone axis to achieve the atomic structure characterization of the sample 016. Further, the driving component 017 drives the first displacement member 020 or the second displacement member 040 in the in-situ mechanical micro-electro-mechanical device, thus achieving the load modes such as tension and compression on the sample 016 arranged on the carrying portion 2242. With the movement of the first displacement member 020 and the second displacement member 040, the signal acquisition module 120 can acquire the capacitance changes of the first sensor assembly 032 and the second sensor assembly 052 at the front and rear sides of the sample 016, and then quantitatively reflect the deformation amount and the load of the sample 016. In this way, the load and deformation amount of the sample 016 can be stably measured at high mechanical resolution while characterizing the sample 016 at the atomic scale.

Figure 18:
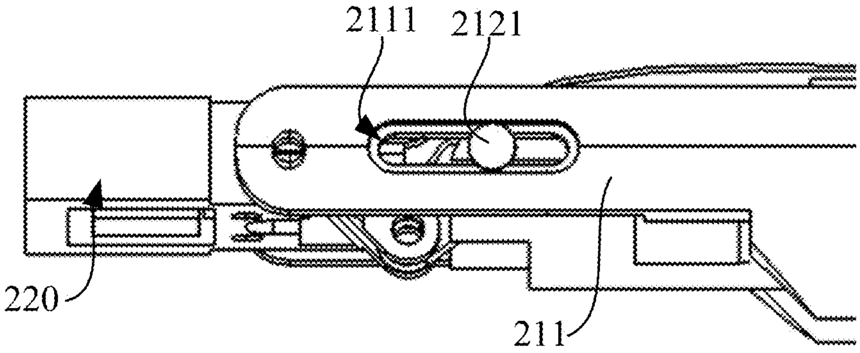
FIG. 18 is a structural diagram of motion guide slots of a double-tilt sample holder according to an embodiment of the present disclosure.

FIG. 18 is a structural diagram of motion guide slots 2111 of a double-tilt sample holder according to an embodiment of the present disclosure.

On the basis of the above embodiments, the difference from the above embodiments is that in a double-tilt sample holder provided by the present disclosure, referring to FIG. 18, a front end of the supporting body 211 is provided with the motion guide slots 2111, and the second rotating end of the connecting rod 223 is rotatably connected to the mounting table 222 by a rotating shaft, and the rotating shaft is in sliding fit with the motion guide slots 2111. Specifically, the front end of the driving rod 212 is provided with a fixing shaft 2121, the driving rod 212 is rotatably connected to the first rotating end of the connecting rod 223 through the fixing shaft 2121, and the fixing shaft 2121 extends through the motion guide slots 2111 at the front end of the supporting body 211, such that the reciprocating linear motion of the driving rod 212 in the axial direction of the supporting body 211 is restricted by the motion guide slots 2111.

On the basis of the above embodiments, the difference from the above embodiments is that in a double-tilt sample holder provided by the present disclosure, the driving device 230 includes a housing 231 and a driving member 232.

Referring to FIG. 12, the housing 231 is provided with a first chamber 2311 and a second chamber 2312 separated from each other, the first chamber 2311 is arranged close to the rod body 210, and communicates with the hollow cavity of the supporting body 211. The driving member 232 is arranged in the first chamber 2311, such that the driving member 232 can be in transmission connection with the rear end of the driving rod 212 to drive the driving rod 212. The second chamber 2312 is hermetically arranged. The signal acquisition module 120 in the in-situ mechanical micro-electro-mechanical system is arranged in the second chamber 2312 which has a good shielding effect. The signal acquisition module 120 is made of a double-sided copper clad plate and fixed in the second chamber 2312 by fasteners such as bolts or screws. In this way, the low signal noise can be ensured, and the stability and accuracy of mechanical data measurement can be improved.

Finally, it should be noted that the above embodiments are only used to illustrate the technical solution of the present disclosure rather than limiting. Although the present disclosure has been described in detail with reference to the foregoing embodiments, those of ordinary skill in the art should understand that it is still possible to modify the technical solution described in the foregoing embodiments, or to replace some technical features with equivalents.

However, these modifications or replacements do not make the essence of the corresponding technical solutions deviate from the spirit and scope of the technical solutions of various embodiments of the present disclosure.

What is claimed is:

1. An in-situ mechanical micro-electro-mechanical device, comprising:

a base (010), provided with a first hollow-out cavity (011), a second hollow-out cavity (012), and a third hollow-out cavity (013), wherein the third hollow-out cavity (013) is located between the first hollow-out cavity (011) and the second hollow-out cavity (012);

a first displacement member (020), wherein the first displacement member (020) is arranged in the first hollow-out cavity (011) through a first mechanical measurement assembly (030), extends to the third hollow-out cavity (013), and is provided with a first sample carrying portion (021) at an extending end thereof; and a second displacement member (040), wherein the second displacement member (040) is arranged in the second hollow-out cavity (012) through a second mechanical measurement assembly (050), extends to the third hollow-out cavity (013), and is provided with a second sample carrying portion (041) at an extending end thereof, and the second sample carrying portion (041) is nested with the first sample carrying portion (021);

wherein one of the first displacement member (020) and the second displacement member (040) is fixedly arranged, and an other of the first displacement member (020) and the second displacement member (040) is connected to a driving component (017).

2. The in-situ mechanical micro-electro-mechanical device according to claim 1, wherein the first mechanical measurement assembly (030) comprises a first elastic support member (031), a first sensor assembly (032), and a first conductor wire assembly (033); and the first elastic support member (031) and the first sensor assembly (032) are connected to an integrated module (110) through the first conductor wire assembly (033);

the first elastic support member (031) is located on a moving path of the first displacement member (020) and fixedly connected to the first displacement member (020), and both ends of the first elastic support member (031) are fixed to the base (010); and the first sensor assembly (032) is arranged on at least one side of the first displacement member (030), and part of the first sensor assembly (032) is adapted to move with the first displacement member (020) to change a capacitance of the first sensor assembly (032).

3. The in-situ mechanical micro-electro-mechanical device according to claim 2, wherein the first sensor assembly (032) comprises a plurality of first fixed polar plates (0321), and a plurality of first follow-up polar plates (0322);

the plurality of first follow-up polar plates (0322) are arranged on the first displacement member (020) at intervals in a moving direction of the first displacement member (020); and the plurality of first fixed polar plates (0321) are arranged on the base (010) at intervals in the moving direction of the first displacement member (020), and each of the plurality of first fixed polar plates (0321) is located between two adjacent first follow-up polar plates (0322).

4. The in-situ mechanical micro-electro-mechanical device according to claim 3, wherein the first conductor wire assembly (033) comprises a first branch conductor wire (0331), and a second branch conductor wire (0332);

the first branch conductor wire (0331) is connected to the plurality of first fixed polar plates (0321) through a metal adhesive layer arranged on the base (010); and the second branch conductor wire (0332) is connected to the first elastic support member (031) through a pressure welding zone arranged on the base (010).

5. The in-situ mechanical micro-electro-mechanical device according to claim 1, wherein the second measurement assembly (050) comprises a second elastic support member (051), a second sensor assembly (052), and a second conductor wire assembly (053); and the second elastic support member (051) and the second sensor assembly (052) are connected to an integrated module (110) through the second conductor wire assembly (053);

the second elastic support member (051) is located on a moving path of the second displacement member (040) and fixedly connected to the second displacement member (040), and both ends of the second elastic support member (051) are fixed to the base (010); and the second sensor assembly (052) is arranged on at least one side of the second displacement member (040), and part of the second sensor assembly (052) is adapted to move with the second displacement member (040) to change a capacitance of the second sensor assembly (052).

6. The in-situ mechanical micro-electro-mechanical device according to claim 5, wherein the second sensor assembly (052) comprises a plurality of second fixed polar plates (0521), and a plurality of second follow-up polar plates (0522);

the plurality of second follow-up polar plates (0522) are arranged on the second displacement member (040) at intervals in a moving direction of the second displacement member (040); and the plurality of second fixed polar plates (0521) are arranged on the base (010) at intervals in the moving direction of the second displacement member (040), and each of the plurality of second fixed polar plates (0521) is located between two adjacent second follow-up polar plates (0522).

7. The in-situ mechanical micro-electro-mechanical device according to claim 6, wherein the second conductor wire assembly (053) comprises a third branch conductor wire (0531), and a fourth branch conductor wire (0532);

the third branch conductor wire (0531) is connected to the plurality of second fixed polar plates (0521) through a metal adhesive layer arranged on the base (010); and the fourth branch conductor wire (0532) is connected to the second elastic support member (051) through a pressure welding zone arranged on the base (010).

8. An in-situ mechanical micro-electro-mechanical system, comprising an integrated module (110), a signal acquisition module (120), and the in-situ mechanical micro-electro-mechanical device according to claim 1;

wherein the integrated module (110) is electrically connected to the in-situ mechanical micro-electro-mechanical device by a first flexible conductor wire (130), and the integrated module (110) is electrically connected to the signal acquisition module (120) by a second flexible conductor wire.

9. The in-situ mechanical micro-electro-mechanical system according to claim 8, wherein the integrated module (110) comprises a plurality of capacitance acquisition interfaces (111), a capacitance acquisition-conversion circuit (112), and signal output interfaces (113) which are connected to one another; the plurality of capacitance acquisition interfaces (111) are connected to the in-situ mechanical micro-electro-mechanical device through the first flexible conductor wire (130), and the signal output interfaces (113) are connected to the signal acquisition module (120) through the second flexible conductor wire.

10. The in-situ mechanical micro-electro-mechanical system according to claim 9, wherein the signal acquisition module (120) comprises a single chip microcomputer (121), and signal acquisition interfaces (122) and a serial communication interface (123) which are connected to the single chip microcomputer (121), the signal acquisition interfaces (122) are connected to the signal output interfaces (113) through the second flexible conductor wire.

11. A double-tilt sample holder which is used based on transmission electron microscope (TEM), comprising:

a driving device (230);

a rod body (210), comprising a supporting body (211) and a driving rod (212), wherein the supporting body (211) is provided with a hollow cavity, the driving rod (212) penetrates through the hollow cavity, one end of the driving rod (212) is connected to the driving device (230) and the driving rod (212) is adapted to reciprocate along an inner wall of the hollow cavity under an action of the driving device (230);

a tilting table (220), rotatably connected to the supporting body (211) and hinged with the driving rod (212), wherein the tilting table (220) is adapted to move with the driving rod (212) for being tilted; and the in-situ mechanical micro-electro-mechanical system according to claim 8, wherein various components of the in-situ mechanical micro-electro-mechanical system are arranged on the tilting table (220), the rod body (210) and the driving device (230), respectively.

12. The double-tilt sample holder according to claim 11, wherein the tilting table (220) comprises:

a tilting body (221), provided with a U-shaped tilting slot (2211);

a mounting table (222), located in the tilting slot (2211) and rotatably connected to the tilting body (221);

a connecting rod (223), wherein one end of the connecting rod (223) is rotatably connected to the mounting table (222), and an other end of the connecting rod (223) is rotatably connected to the driving rod (212); and a carrying member (224), fixedly arranged on the mounting table (222), wherein the carrying member (224) is provided with a carrying cavity (2241), and the in-situ mechanical micro-electro-mechanical device of the in-situ mechanical micro-electro-mechanical system is embedded into the carrying cavity (2241).

13. The double-tilt sample holder according to claim 12, wherein a front end of the supporting body (211) is provided with motion guide slots (2111), the connecting rod (223) is rotatably connected to the mounting table (222) through a rotating shaft, and the rotating shaft is in sliding fit with the motion guide slots (2111).

14. The double-tilt sample holder according to claim 11, wherein the driving device (230) comprises:

a housing (231), provided with a first chamber (2311) and a second chamber (2312) separated from each other, wherein the first chamber (2311) is close to the rod body (210), and the second chamber (2312) is hermetically arranged; and a driving member (232), arranged in the first chamber (2311) and connected to the driving rod (212);

wherein the signal acquisition module (120) in the in-situ mechanical micro-electro-mechanical system is arranged in the second chamber (2312).

15. The double-tilt sample holder according to claim 11, wherein the integrated module (110) comprises a plurality of capacitance acquisition interfaces (111), a capacitance acquisition-conversion circuit (112), and signal output interfaces (113) which are connected to one another; the plurality of capacitance acquisition interfaces (111) are connected to the in-situ mechanical micro-electro-mechanical device through the first flexible conductor wire (130), and the signal output interfaces (113) are connected to the signal acquisition module (120) through the second flexible conductor wire.

16. The double-tilt sample holder according to claim 15, wherein the signal acquisition module (120) comprises a single chip microcomputer (121), and signal acquisition interfaces (122) and a serial communication interface (123) which are connected to the single chip microcomputer (121), the signal acquisition interfaces (122) are connected to the signal output interfaces (113) through the second flexible conductor wire.

17. The in-situ mechanical micro-electro-mechanical system according to claim 8, wherein the first mechanical measurement assembly (030) comprises a first elastic support member (031), a first sensor assembly (032), and a first conductor wire assembly (033); and the first elastic support member (031) and the first sensor assembly (032) are connected to an integrated module (110) through the first conductor wire assembly (033);

the first elastic support member (031) is located on a moving path of the first displacement member (020) and fixedly connected to the first displacement member (020), and both ends of the first elastic support member (031) are fixed to the base (010); and the first sensor assembly (032) is arranged on at least one side of the first displacement member (030), and part of the first sensor assembly (032) is adapted to move with the first displacement member (020) to change a capacitance of the first sensor assembly (032).

18. The in-situ mechanical micro-electro-mechanical system according to claim 17, wherein the first sensor assembly (032) comprises a plurality of first fixed polar plates (0321), and a plurality of first follow-up polar plates (0322);

the plurality of first follow-up polar plates (0322) are arranged on the first displacement member (020) at intervals in a moving direction of the first displacement member (020); and the plurality of first fixed polar plates (0321) are arranged on the base (010) at intervals in the moving direction of the first displacement member (020), and each of the plurality of first fixed polar plates (0321) is located between two adjacent first follow-up polar plates (0322).

19. The in-situ mechanical micro-electro-mechanical system according to claim 18, wherein the first conductor wire assembly (033) comprises a first branch conductor wire (0331), and a second branch conductor wire (0332);

the first branch conductor wire (0331) is connected to the plurality of first fixed polar plates (0321) through a metal adhesive layer arranged on the base (010); and the second branch conductor wire (0332) is connected to the first elastic support member (031) through a pressure welding zone arranged on the base (010).

20. The in-situ mechanical micro-electro-mechanical system according to claim 8, wherein the second measurement assembly (050) comprises a second elastic support member (051), a second sensor assembly (052), and a second conductor wire assembly (053); and the second elastic support member (051) and the second sensor assembly (052) are connected to an integrated module (110) through the second conductor wire assembly (053);

the second elastic support member (051) is located on a moving path of the second displacement member (040) and fixedly connected to the second displacement member (040), and both ends of the second elastic support member (051) are fixed to the base (010); and the second sensor assembly (052) is arranged on at least one side of the second displacement member (040), and part of the second sensor assembly (052) is adapted to move with the second displacement member (040) to change a capacitance of the second sensor assembly (052).

* * * * *